US012362337B2

(12) United States Patent
Omori

(10) Patent No.: US 12,362,337 B2
(45) Date of Patent: Jul. 15, 2025

(54) LIGHT EMITTING DEVICE

(71) Applicants: CITIZEN ELECTRONICS CO., LTD., Fujiyoshida (JP); CITIZEN WATCH CO., LTD., Nishitokyo (JP)

(72) Inventor: Yuji Omori, Fujiyoshida (JP)

(73) Assignees: CITIZEN ELECTRONICS CO., LTD., Fujiyoshida (JP); CITIZEN WATCH CO., LTD., Nishitokyo (JP)

( * ) Notice: Subject to any disclaimer, the term of this patent is extended or adjusted under 35 U.S.C. 154(b) by 566 days.

(21) Appl. No.: 17/942,084

(22) Filed: Sep. 9, 2022

(65) Prior Publication Data

US 2023/0005891 A1 Jan. 5, 2023

Related U.S. Application Data

(63) Continuation of application No. PCT/JP2021/009056, filed on Mar. 8, 2021.

(30) Foreign Application Priority Data

Mar. 10, 2020 (JP) .................. 2020-041153

(51) Int. Cl.
*H01L 25/075* (2006.01)
*H10H 20/01* (2025.01)
(Continued)

(52) U.S. Cl.
CPC ..... *H01L 25/0753* (2013.01); *H10H 20/8516* (2025.01); *H10H 20/854* (2025.01);
(Continued)

(58) Field of Classification Search
CPC ............. H10H 20/854; H10H 20/8516; H10H 20/857; H10H 20/0362; H10H 20/0361; H10H 20/8512
See application file for complete search history.

(56) References Cited

U.S. PATENT DOCUMENTS

2008/0290351 A1 11/2008 Ajiki et al.
2014/0055996 A1* 2/2014 Shimozawa ........ H01L 25/0753
362/235
(Continued)

FOREIGN PATENT DOCUMENTS

JP 2008-218733 A 9/2008
JP 2008-294224 A 12/2008
(Continued)

OTHER PUBLICATIONS

International Search Report received in Application No. PCT/JP2021/009056, dated May 18, 2021, in 5 pages with English Translation.
(Continued)

*Primary Examiner* — Mark W Tornow
(74) *Attorney, Agent, or Firm* — Procopio, Cory, Hargreaves & Savitch LLP

(57) ABSTRACT

A light emitting device has a substrate, a plurality of light emitting elements mounted on the substrate, a first wavelength conversion members disposed so as to cover at least a portion of the upper surface of at least two light emitting elements of the plurality of light emitting elements, a sealing material sealing the plurality of light emitting elements and the first wavelength conversion members, and a transparent layer formed of a material different from the sealing material and is disposed between the substrate, the plurality of light emitting elements and the first wavelength conversion members, and the sealing material, wherein at least one side of each of the plurality of light emitting elements is disposed so as to face a side surface of the other light emitting element of the at least two light emitting elements, and not cover at least a portion of the non-facing side surfaces thereof.

20 Claims, 23 Drawing Sheets

(51) Int. Cl.
*H10H 20/851* (2025.01)
*H10H 20/854* (2025.01)
*H10H 20/857* (2025.01)

(52) U.S. Cl.
CPC ....... *H10H 20/857* (2025.01); *H10H 20/0361* (2025.01); *H10H 20/0362* (2025.01); *H10H 20/8512* (2025.01)

(56) References Cited

U.S. PATENT DOCUMENTS

| | | | | |
|---|---|---|---|---|
| 2015/0091025 A1* | 4/2015 | Tsuchiya | ............ | H01L 25/0753 |
| | | | | 438/28 |
| 2015/0260351 A1* | 9/2015 | Hiramatsu | ............. | F21S 8/026 |
| | | | | 362/231 |
| 2016/0276553 A1* | 9/2016 | Okubo | ................. | H10H 20/852 |
| 2019/0371974 A1 | 12/2019 | Hussell | | |

FOREIGN PATENT DOCUMENTS

| | | | |
|---|---|---|---|
| JP | 2014-045089 | A | 3/2014 |
| JP | 2016-174120 | A | 9/2016 |
| JP | 2017-143109 | A | 8/2017 |
| JP | 2019-003978 | A | 1/2019 |

OTHER PUBLICATIONS

Written Opinion received in Application No. PCT/JP2021/009056, dated May 18, 2021, in 4 pages.
International Preliminary Report on Patentability received in Application No. PCT/JP2021/009056, dated Jun. 14, 2022, in 14 pages with English Translation.

\* cited by examiner

LIGHT EMITTING DEVICE

CROSS-REFERENCE TO RELATED APPLICATION

This application is based upon and claims the benefits of priorities of the prior Japanese Patent Application No. 2020-041153 filed on Mar. 10, 2020, and prior International Patent Application No. PCT/JP2021/009056 filed on Mar. 8, 2021, the entire contents of which are incorporated herein by reference.

TECHNICAL FIELD

The present disclosure relates to a light emitting device.

BACK GROUND

A light emitting device is known which may emit light having high color mixability and different color temperatures. For example, JP 2014-45089 A discloses a light emitting device in which a plurality of LED dies are grouped streaky or mosaic to form an LED die groups, each of the LED die groups is coated with at least two kinds of phosphor layers. A light emitting device is described in JP 2014-45089 A that may emit light having a plurality of colors with high color mixability, by forming a plurality of LED die groups coated with phosphor layers emitting light different color temperature.

SUMMARY

However, in the light emitting device described in JP 2014-45089 A, since the phosphor layers covering the LED die group are disposed so as to cover all four side surfaces in addition to upper surfaces of the LED dies included in the LED die groups, the amount of phosphor disposed around the LED die is increased.

The amount of phosphor disposed around the LED die may be reduced, by disposing phosphors only on the top surfaces of the LED dies. However, if phosphors are only disposed on the upper surfaces of the LED dies, the amount of phosphor disposed on the upper surface of the LED die is increased, and therefore the luminous efficiency of the light emitting device may be reduced.

An object of the present disclosure is to provide a light emitting device whose luminous efficiency is not easily reduced, whereas amount of phosphors used therein is suppressed.

In order to solve the above object, a light emitting device according to the present disclosure has a substrate, a plurality of light emitting elements mounted on the substrate, wherein each of the plurality of light emitting elements has a rectangular planar shape, a first wavelength conversion members disposed so as to cover at least a portion of the upper surface of at least two light emitting elements of the plurality of light emitting elements, a sealing material sealing the plurality of light emitting elements and the first wavelength conversion members, and a transparent layer formed of a material different from the sealing material and is disposed between the substrate, the plurality of light emitting elements and the first wavelength conversion members, and the sealing material, wherein at least one side of each of the at least two light emitting elements is disposed so as to face a side surface of the other light emitting element of the at least two light emitting elements, the first wavelength conversion members are disposed so as to cover at least a portion of the facing side surfaces of the at least two light emitting elements, and the first wavelength conversion members are disposed so as not to cover at least a portion of the non-facing side surfaces of the at least two light emitting elements.

It is preferable in the light emitting device according to the present disclosure that the first wavelength conversion members are disposed so as to cover the vicinity of the non-facing side surface adjacent to the facing side surfaces of the at least two light emitting elements.

It is preferable in the light emitting device according to the present disclosure that the plurality of light emitting elements include a plurality of first light emitting element rows in which the light emitting elements connected in series are disposed so that the first wavelength conversion members cover the upper surface and the facing side surfaces of the light emitting elements, and a plurality of second light emitting element rows in which the light emitting elements connected in series are disposed so that the first wavelength conversion members do not cover the upper surface and the facing side surfaces of the light emitting elements.

It is preferable in the light emitting device according to the present disclosure that each of the plurality of first light emitting element rows includes first light emitting element groups having a plurality of light emitting elements disposed in each of the plurality of first mounting areas having the same area.

It is preferable in the light emitting device according to the present disclosure that each of the plurality of first light emitting element groups includes four light emitting elements disposed in two rows and two columns.

It is preferable in the light emitting device according to the present disclosure that each of the plurality of second light emitting element rows includes a second light emitting element groups having a plurality of light emitting elements disposed in each of the plurality of second mounting areas having the same area.

It is preferable in the light emitting device according to the present disclosure that the second light emitting element row includes a light emitting element that is not disposed in any of the second mounting areas.

It is preferable in the light emitting device according to the present disclosure that the light emitting element that is not disposed in any of the second mounting areas is disposed in an area between any of the first mounting areas and the outer edge of the mounting area on which the light emitting elements are mounted.

It is preferable in the light emitting device according to the present disclosure that the sealing material includes second wavelength conversion members, a color temperature of first light emitted when the light emitting elements included in each of the plurality of first light emitting element rows emits light is different from a color temperature of the second light emitted when the light emitting elements included in each of the plurality of second light emitting element rows emits light.

It is preferable in the light emitting device according to the present disclosure that the plurality of first light emitting element groups and the plurality of second light emitting element groups are disposed in parallel in the same direction.

It is preferable in the light emitting device according to the present disclosure that the plurality of first light emitting element groups and the plurality of second light emitting element groups are disposed in a straight line.

It is preferable in the light emitting device according to the present disclosure that the plurality of first light emitting element groups and the plurality of second light emitting element groups are disposed in a zigzag manner.

It is preferable for the light emitting device according to the present disclosure that further has a pair of first electrode pairs providing power to the plurality of first light emitting element rows, first wiring patterns electrically connecting the plurality of first light emitting element rows and the pair of first electrode pairs, a first overvoltage prevention element connected in parallel with the plurality of first light emitting elements, a pair of second electrode pairs providing power to the plurality of second light emitting element rows, second wiring patterns electrically connecting the plurality of second light emitting element rows and the pair of second electrode pairs, and a second overvoltage preventing element connected in parallel with the plurality of second light emitting element, wherein one of the first wiring patterns and the second wiring patterns has a plurality of wiring patterns electrically connected via a bonding wire.

It is preferable in the light emitting device according to the present disclosure that one end of the bonding wire is connected to the wiring pattern connected to one of the first overvoltage preventing element and the second overvoltage preventing element.

It is preferable in the light emitting device according to the present disclosure that the transparent layer is disposed at least a portion of the first wavelength conversion members.

It is preferable in the light emitting device according to the present disclosure that the transparent layer is further disposed between the substrate, the plurality of light emitting elements and the first wavelength conversion members, and the sealing material.

A light emitting device according to the present disclosure has a substrate, a plurality of light emitting elements mounted on the substrate, wherein each of the plurality of light emitting elements has a rectangular planar shape, a first wavelength conversion members disposed so as to cover at least a portion of the upper surface of at least two light emitting elements of the plurality of light emitting elements, and a sealing material sealing the plurality of light emitting elements and the first wavelength conversion members, wherein at least one side of each of the plurality of light emitting elements is disposed so as to face a side surface of the other light emitting element of the at least two light emitting elements, the first wavelength conversion members are disposed so as to cover at least a portion of the facing side surfaces of the at least two light emitting elements, and the first wavelength conversion members are disposed on the upper surface of the at least two light emitting elements so as not to cover the vicinity of corners on the upper surfaces of the at least two light emitting elements most apart from the facing side surfaces of the at least two light emitting elements.

It is preferable in the light emitting device according to the present disclosure that the light emitting device further comprising a transparent layer formed of a material different from the sealing material and is disposed between the substrate, the plurality of light emitting elements and the first wavelength conversion members, and the sealing material.

A light emitting device according to the present disclosure has a substrate, a plurality of light emitting elements mounted on the substrate, wherein each of the plurality of light emitting elements has a rectangular planar shape, a first wavelength conversion members disposed so as to cover at least a portion of the upper surface of at least two light emitting elements of the plurality of light emitting elements, and a sealing material sealing the plurality of light emitting elements and the first wavelength conversion members, wherein at least one side of each of the plurality of light emitting elements is disposed so as to face a side surface of the other light emitting element of the at least two light emitting elements, the first wavelength conversion members are disposed so as to cover at least a portion of the facing side surfaces of the at least two light emitting elements, and the first wavelength conversion members are disposed so as not to cover the vicinity of outer side of the facing side surfaces of the at least two light emitting elements.

The luminous efficiency of a light emitting device according to the present disclosure luminous efficiency is not easily reduced, whereas amount of phosphors used therein is suppressed.

DESCRIPTION

Hereinafter, with reference to the drawings various embodiments will be explained. However, the technical scope of the present invention is not limited to those embodiments, but spans the claimed invention and its equivalents.

(Light Emitting Device According to a First Embodiment)

Figure 1:
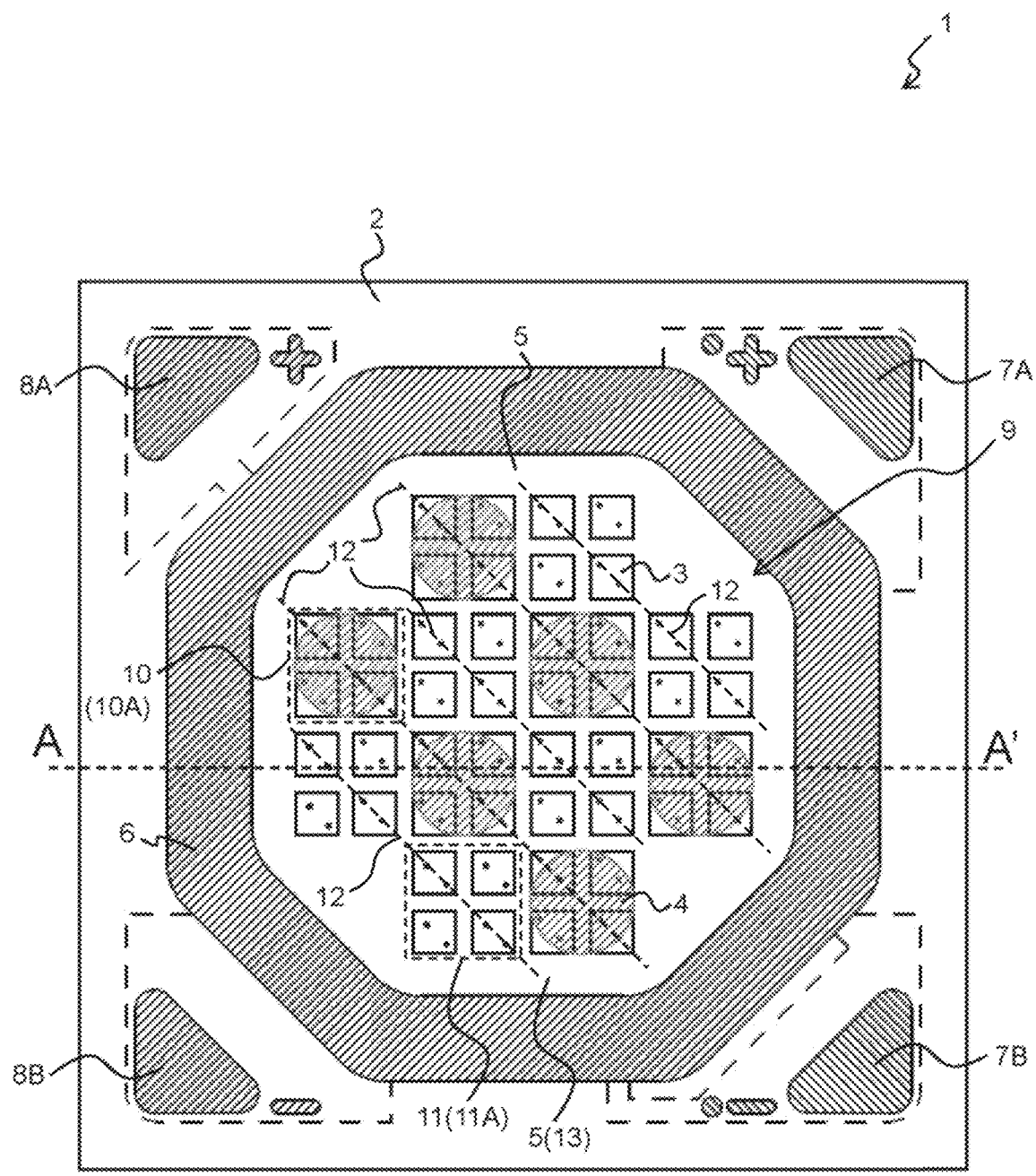
FIG. 1 is a plan view of a light emitting device according to a first embodiment.
Figure 2A:
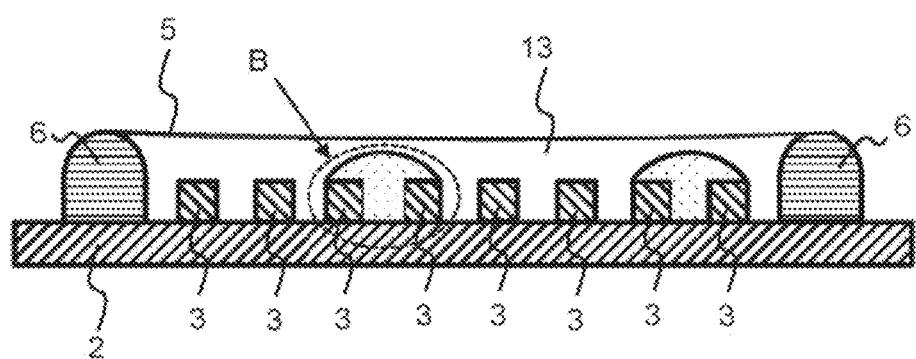
FIG. 2A is a sectional view taken along A-A' of the light emitting device shown in FIG. 1.
Figure 2B:
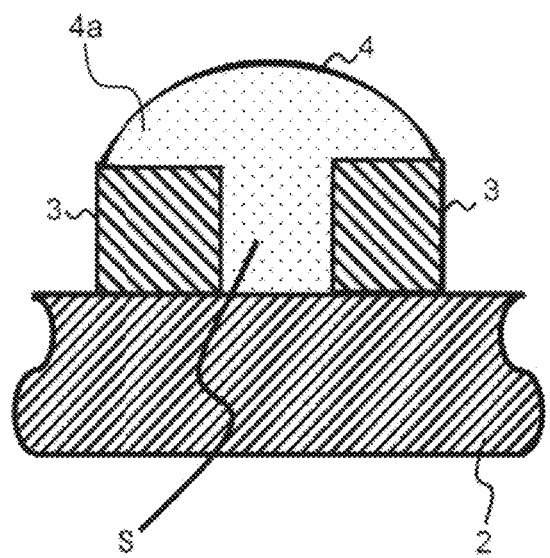
FIG. 2B is a portion enlarged view shown by an arrow B in FIG. 2A.
Figure 2C:
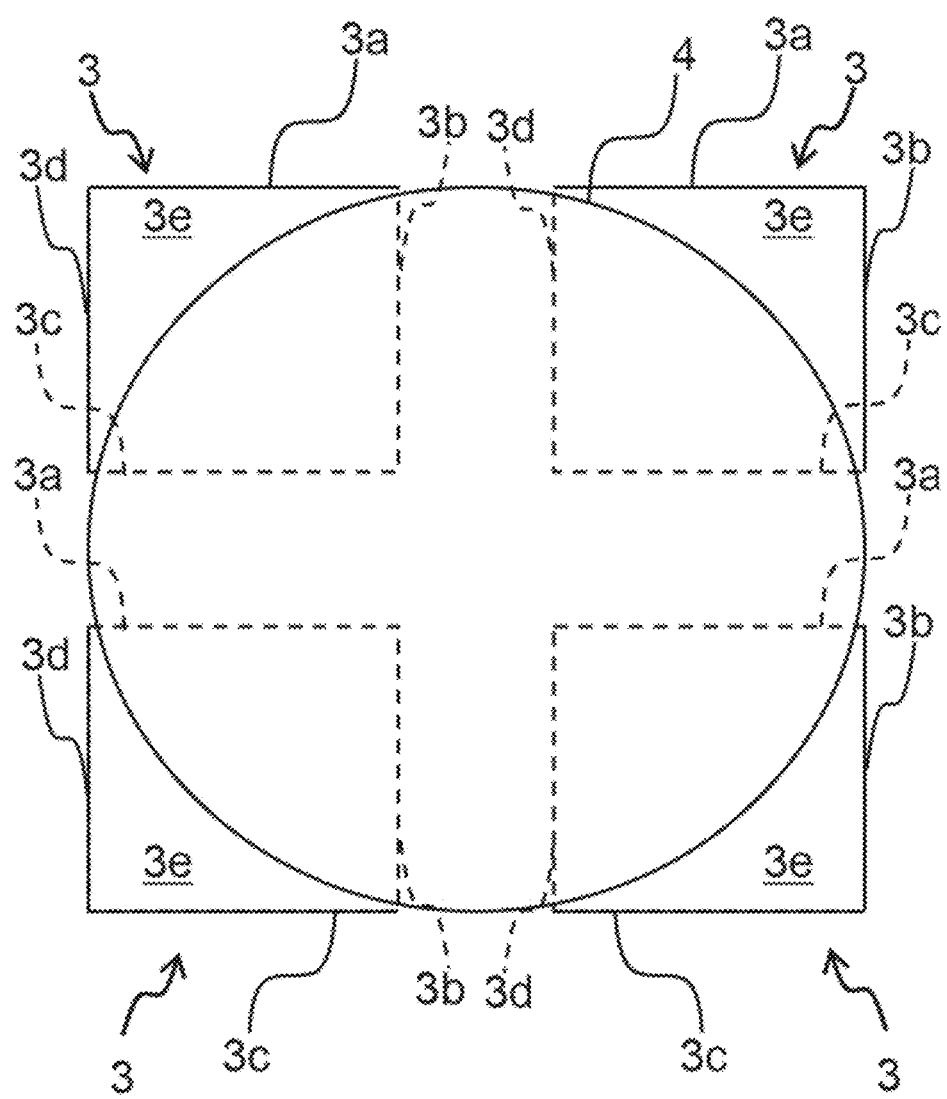
FIG. 2C is a plan view of the light emitting device shown in FIG. 1.

FIG. 1 is a plan view of a light emitting device according to a first embodiment, FIG. 2A is a sectional view taken along A-A' of the light emitting device shown in FIG. 1, FIG. 2B is a portion enlarged view shown by an arrow B in FIG. 2A, and FIG. 2C is a plan view of the light emitting device shown in FIG. 1. Bonding wires are omitted in FIG. 1, FIG. 2A, FIG. 2B and FIG. 2C.

A light emitting device 1 has a substrate 2, a plurality of light emitting elements 3, a first phosphor including resin 4, a sealing material 5 and a dam material 6.

The substrate 2 is a flat substrate formed of an insulating resin such as glass epoxy. The substrate 2 has a square shaped planar shape, and a first electrode pair 7A and 7B and a second electrode pair 8A and 8B are disposed on the substrate 2. The substrate 2 may have planar shapes rather than a square, such as a rectangle, and may be formed by a mounting substrate formed of a member having a high thermal conductivity such as aluminum, and an insulated circuit substrate on which wiring patterns are formed.

The first electrode pair 7A and 7B and the second electrode pair 8A and 8B are formed of conductive members such as gold plating on the upper surface of the substrate 2, and are anode terminals and cathode terminals for supplying power supplied from an external power source (not shown) to each of the plurality of light emitting elements 3. A mounting area 9 on which the plurality of light emitting elements 3 are mounted has a substantially regular octagonal planar shape, and are formed on the center portion of the substrate 2. The planar shape of the mounting area 9 is not limited to substantially regular octagon, and may be other shapes such a circular, a cyclic and polygonal.

The light emitting elements 3 are LED (Light Emitting Diode) dies that emit blue light, and 48 light emitting elements 3 are disposed on the mounting area 9. Each of the light emitting elements 3 has a rectangular planar shape on a top-down view, and has a first side surface 3a, a second side surface 3b, a third side surface 3c, a fourth side surface 3d and an upper surface 3e. The light emitting elements 3 are mounted on the mounting area 9 of the substrate 2, so that at least two side surfaces a first side surface 3a, a second side surface 3b, a third side surface 3c and a fourth side surface 3d facing side surfaces of the other light emitting elements 3. The light emitting elements 3 are disposed so that the facing side surfaces of the pair of light emitting elements 3 are in parallel and face over the entire surface of the facing side surfaces so that when a pair of the light emitting elements 3 are shown from a side surface opposite to the facing surface of one of the pair of the light emitting elements 3, the facing surface of the other of the pair of the light emitting elements 3 is not shown.

In FIG. 2C, the second side surface 3b of the light emitting element 3 on the upper left portion faces over the entire the fourth side surface 3d of the light emitting element 3 on the upper right portion, and the third side surface 3c of the light emitting element 3 on the upper left portion faces over the entire the first side surface 3a of the light emitting element 3 on the lower right portion. The third side surface 3c of the light emitting element 3 on the upper right portion faces over the entire the first side surface 3a of the light emitting element 3 on the lower right portion. The fourth side surface 3d of the light emitting element 3 on the lower right portion faces over the entire the first side surface 3b of the light emitting element 3 on the lower left portion.

In the first phosphor including resin 4, the first phosphors 4a are spread in a transparent resin. The first phosphor 4a is, for example, YAG (Yttrium Aluminum Garnet) phosphor, absorbs blue light emitted by the light emitting elements 3 and emits yellow light. The first phosphor 4a does not limit to YAG phosphor, may be a phosphor which absorbs blue light emitted by the light emitting elements 3 and emit green and/or yellow light such as red, green and yellow. The first phosphor 4a functions as a first wavelength converting member which absorbs blue light emitted by the light emitting elements 3 and emits different color light.

Four light emitting elements 3 which are covered by the first phosphor 4 and disposed in an array of two rows and two columns forms a first light emitting group 10, and mounted on a first mounting area 10A. There are six light emitting element groups similar to the first light emitting group 10 in the mounting area 9, in total, and each of six light emitting element groups is mounted on a region having same area as that of the first mounting area 10A, as shown in FIG. 1. The first light emitted from the light emitting elements 3 included in the first light emitting element groups 10 and passed through both the first phosphor 4 and the sealing material 5 is warm white light having a color temperature of, for example, 2700K or 3000K.

In the first light emitting group 10, the first phosphor including resin 4 is disposed on the upper surface 4e of each of the four light emitting elements 3 included in the first light emitting element groups 10, and disposed so as to fill a space S which is formed by facing side surfaces 3a to 3d of adjacent light emitting elements 3 and the substrate 2. Since the first phosphor including resin 4 is filled among the four light emitting elements 3 disposed in an array of two rows and two columns, the space S in which the first phosphor including resin 4 is filled among the four light emitting elements 3 included in the first light emitting element group 10 has a cross shaped planar shape.

Since the first phosphor including resin 4 is filled in the space S in addition to the upper surface of the light emitting element 3, an area where the first phosphor including resin 4 is disposed in the vicinity of the light emitting element 3 is increased, comparing with a case in which the first phosphor including resin 4 is only on the upper surfaces of the light emitting elements 3. In the light emitting device 1, since the area where the first phosphor including resin 4 is disposed in the vicinity of the light emitting element 3 is increased, comparing with the case in which the first phosphor 4 is only on the upper surfaces of the light emitting elements 3, the amount of the first phosphor including resin 4 disposed on the upper surfaces of the light emitting elements 3 and phosphor 4a included in the first phosphor including resin 4 may be reduced. The light emitting device 1 may increase the luminous efficiency, since the first phosphor 4 filled in the space S, and the amount of the first phosphor 4a disposed on the upper surfaces of the light emitting elements 3 is reduced, and heat from the first phosphors 4a is reduced, and therefore the possibility for decreasing the luminous efficiency by heating an area around the light emitting elements 3 is reduced.

Four light emitting elements 3 which are not covered by the first phosphor 4 and disposed in an array of two rows and two columns forms a second light emitting group 11, and mounted on a first mounting area 11A. There are six light emitting element groups similar to the second light emitting group 11 in the mounting area 9, in total, and each of six light emitting element groups is mounted on a region having same area as that of the second mounting area 11A, as shown in FIG. 1.

The sealing material 5 is a transparent resin such as silicone resin filled in a space on the mounting area 9, and seals the plurality of light emitting elements 3 and the first phosphor including resin 4 Further, the sealing material 5 contains second phosphors 13. The second phosphors 13 are, for example, YAG, absorbs blue light emitted by the light emitting element 3, and emits yellow light. The second phosphors 13 does not limit to YAG phosphor, may include phosphors which absorb blue light emitted by the light emitting elements 3 and emits green and/or yellow light such as red, green and yellow. Further, the second phosphors 13 may include phosphors which absorb blue light emitted by the light emitting elements 3 and emits green and/or yellow light such as red, green and yellow, in addition to phosphors which absorbs blue light emitted by the light emitting element 3, and emits yellow light. The first phosphor 13 functions as a first wavelength converting member which absorbs blue light emitted by the light emitting elements 3 and emits different color light. The color of the light emitted from the second phosphors 13 is different from that of the light emitted from the first phosphors 4a. The second light emitted from the light emitting elements 3 included in the second light emitting element groups 11 and passing through the sealing material 5 is cool white light, for example, having temperature of 5000K.

The dam material 6 is a frame material formed of opaque silicone resin including white particles, prevents the sealing material 5 filled in the mounting area 9 from outflowing, and reflects the light emitted from the light emitting elements 3, the first phosphors 4a and the second phosphors 13.

Each of the plurality of first light emitting element groups 10 and the plurality of second light emitting element groups 11 is disposed in a straight line parallel to the extending direction of the broken line 12 in FIG. 1.

Figure 3:
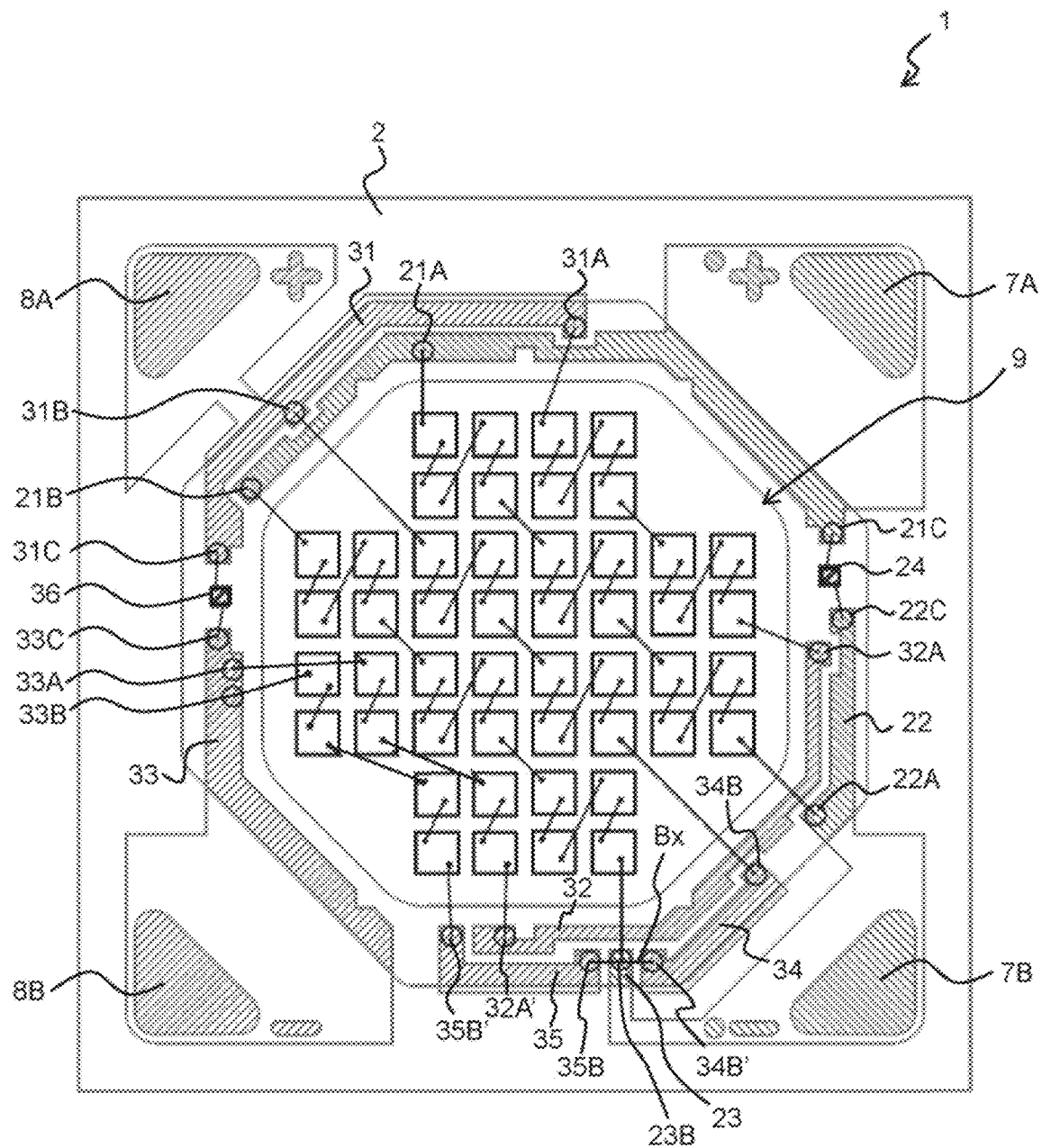
FIG. 3 is a plan view of the light emitting device shown in FIG. 1 omitting the sealing material and the dam material.
Figure 4:
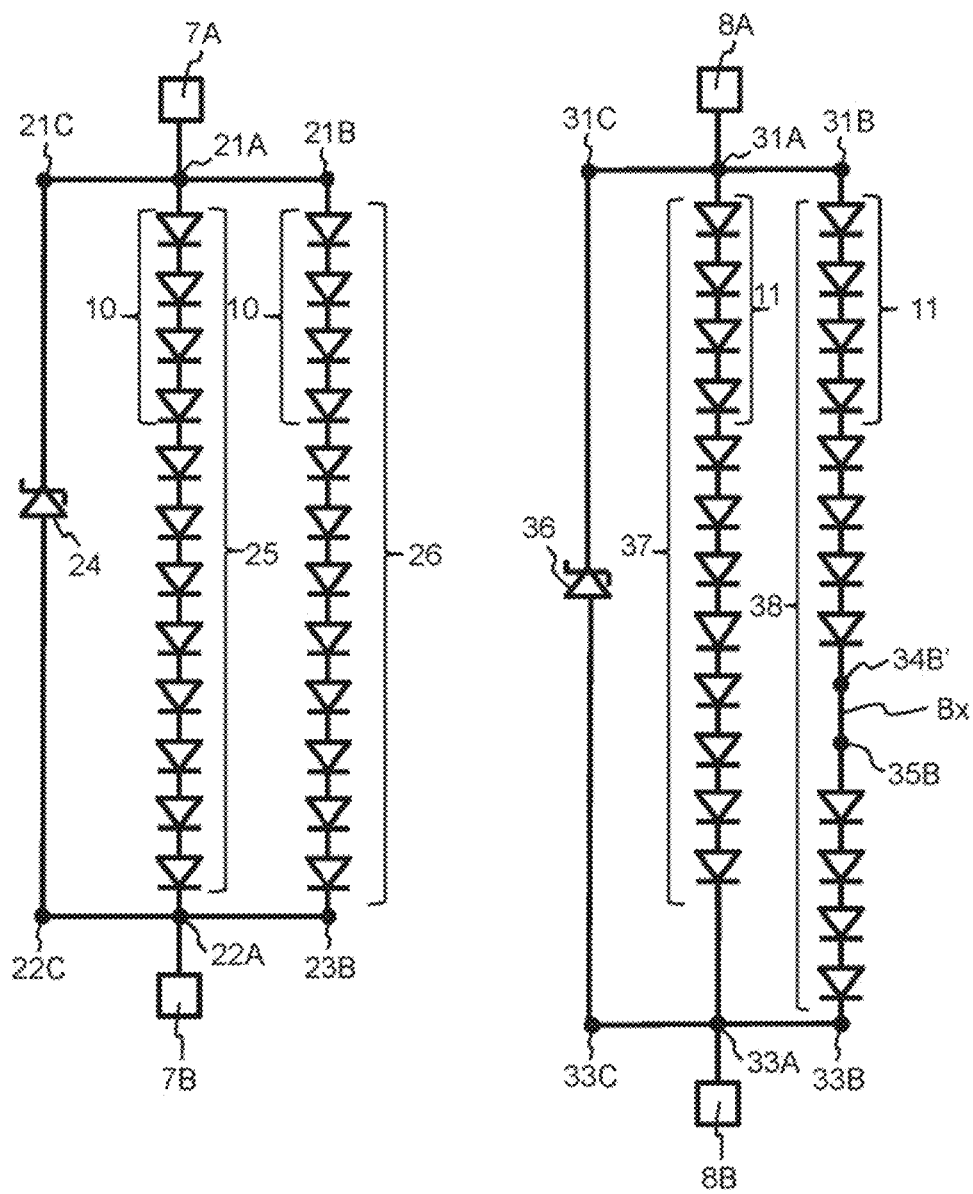
FIG. 4 is a circuit diagram of the light emitting device 1.

FIG. 3 is a plan view of the light emitting device 1 omitting the sealing material 5 and the dam material 6, and FIG. 4 is a circuit diagram of the light emitting device 1.

The light emitting device 1 further has first wiring patterns 21 to 23, a first overvoltage prevention element 24, second wiring patterns 31 to 35 and a second overvoltage prevention element 36.

Four light emitting elements 3 included in the first light emitting element groups 10 are connected in series via a bonding wires. Further, the four light emitting elements 3 included in the second light emitting element groups 11 are connected in series via a bonding wires. Three first light emitting element groups 10 are connected in series via bonding wires to form a first light emitting element row 25. Other three first light emitting element groups 10 are connected in series via bonding wires to form another first light emitting element row 26. The first light emitting element rows 25 and 26 form a pair of first light emitting element rows which are connected in parallel. Three second light emitting element groups 11 are connected in series via bonding wires to form a first second emitting element row 37. Other three second light emitting element groups 11 are connected in series via bonding wires to form another second light emitting element row 38. The second light emitting element rows 37 and 38 form a pair of second light emitting element rows which are connected in parallel.

The first light emitting element rows 25 and 26 are connected to the first electrode pair 7A and 7B through the first wiring patterns 21 to 23 and are connected in parallel with the first overvoltage preventing element 24. The second light emitting element rows 37 and 38 are connected to the second electrode pair 8A and 8B through the second wiring patterns 31 to 35 and are connected in parallel with the second overvoltage preventing element 36.

The first wiring pattern 21 is a wiring pattern formed integrally with the first electrode 7A, and has contacts 21A, 21B and 21C. The first wiring pattern 22 is a wiring pattern integrally formed with the cathode electrode 7B, and has contacts 22A and 22C. The first wiring pattern 23 is a wiring pattern integrally formed with the cathode electrode 7B, and has a contact 23B.

The first light emitting element row 25 is connected via bonding wires between the contact 21A of the first wiring pattern 21 and the contact 22A of the first wiring pattern 22. The first light emitting element row 26 is connected via bonding wires between the contact 21B of the first wiring pattern 21 and the contact 23B of the first wiring pattern 23.

The first overvoltage preventing element 24 is a zener diode, flows the breakdown current though the first overvoltage preventing element 24, when an overvoltage is applied between the first electrode pair 7A and 7B, and therefore the light emitting element 3 included in the first light emitting element rows 25 and 26 is prevented from applying the overvoltage.

A second wiring pattern 31 is a wiring pattern which is integrally formed with the second electrode pair 8A, is disposed on the outside of the first wiring pattern 21, and has contacts 31A, 31B and 31C. A second wiring pattern 32 is a wiring pattern apart from other wiring patterns, is disposed inside of the first wiring pattern 22, and the second wiring patterns 34 and 35, and has contacts 32A and 32A'. A second wiring pattern 33 is a wiring pattern integrally formed with the cathode electrode 8B, and has contacts 33A, 33B and a 33C. The second wiring pattern 34 is a wiring pattern apart from other wiring patterns, is disposed on the outside of the second wiring pattern 32, and has contacts 34B and 34B'. The second wiring pattern 35 is a wiring pattern apart from other wiring patterns, is disposed on the outside of the second wiring pattern 32, and has contacts 35B and 35B'.

The second light emitting element row 37 is connected between the contact point 31A of the first wiring pattern 31 and the contact point 33A of the second wiring pattern 33 via bonding wires and the second wiring pattern 32. The second light emitting element row 38 is connected between the contact point 31B of the second wiring pattern 31 and the contact 33B of the second wiring pattern 33 via bonding wires, the second wiring pattern 34 and the second wiring pattern 35. A jumper Bx is a bonding wire, and is connected between the second wiring pattern 34 and the second wiring pattern 35.

The second overvoltage preventing element 36 is a zener diode, flows a breakdown current when an overvoltage is applied between the second electrode pair 8A and 8B, and therefore the light emitting elements 3 included in the second light emitting element rows 37 and 38 is prevented from applying the overvoltage.

When a voltage is applied to the first electrode pair 7A and 7B and no voltage is applied to the second electrode pair 8A and 8B, the light emitting elements 3 included in the first light emitting element rows 25 and 26 emit light, and the light emitting device 1 emits first light that is warm white light. When no voltage is applied to the first electrode pair 7A and 7B and a voltage is applied to the second electrode pair 8A and 8B, the light emitting elements 3 included in the second light emitting element rows 37 and 38 emit light, and the light emitting device 1 emits second light that is cool white light. When a voltage is applied to the first electrode pair 7A and 7B and a voltage is applied to the second electrode pair 8A and 8B, all the light emitting elements 3 mounted on the light emitting device 1 emit light, and the light emitting device 1 emits mixed light of the first and second light. The color temperature of the mixed light of the first and second light is an intermediate color temperature of the color temperatures of the first and second light.

Figure 5A:
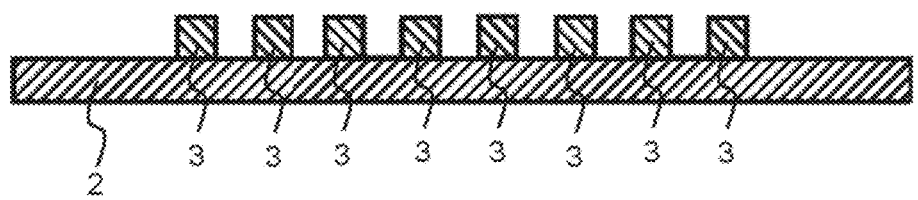
FIG. 5A is a diagram showing step 1 of a method for manufacturing a light emitting device shown in FIG. 1.
Figure 5B:
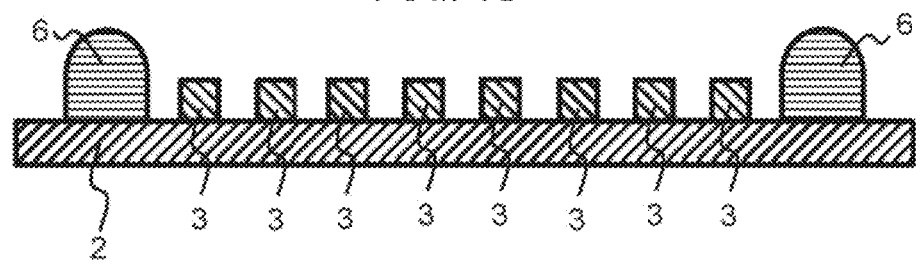
FIG. 5B is a diagram showing step 2 of a method for manufacturing a light emitting device shown in FIG. 1.
Figure 5C:
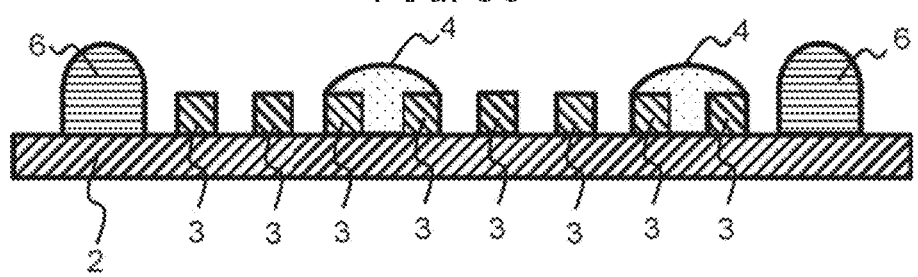
FIG. 5C is a diagram showing step 3 of a method for manufacturing a light emitting device shown in FIG. 1.
Figure 5D:
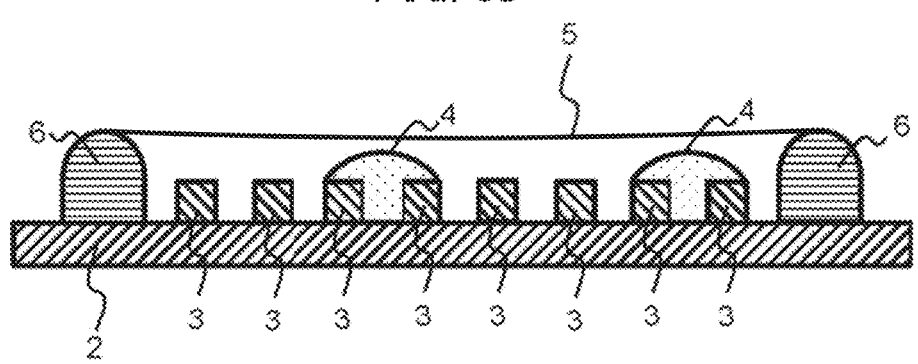
FIG. 5D is a diagram showing step 4 of a method for manufacturing a light emitting device shown in FIG. 1.

FIGS. 5A to 5D are a diagram showing steps of a method for manufacturing a light emitting device 1, FIG. 5A shows a first step, FIG. 5B shows a second step, FIG. 5C shows a third step, and FIG. 5D shows a fourth step. The diagrams shown in FIGS. 5A to 5D are sectional views corresponding to a sectional view taken along A-A' shown in FIG. 1.

First, in the first step, the plurality of light emitting elements 3 are disposed on the mounting area 9 of the substrate 2, and bonding wires connect among the plurality of light emitting elements 3, the second wiring pattern 34 and the second wiring pattern 35. Then, in the second step, the dam material 6 is disposed so as to surround the mounting area 9 along the outer edge of the mounting area 9. Then, in the third step, resins containing the first phosphor 4a are disposed among the facing sides of the four light emitting elements 3 disposed in two rows and two columns included in the first light emitting element group 10 and the upper surface of the four light emitting elements 3. The resins containing the first phosphor 4a are held by the surface tension at the end of the facing side surfaces and upper surfaces of the four light emitting elements 3. Then, in the fourth step, a base material of the sealing material 5 is filled to the inside of the dam material 6, and the base material is solidified, and the manufacturing process of the light emitting device 1 is completed.

(Effect of the Light Emitting Device According to the First Embodiment)

Since the first light emitting element groups 10 for emitting the first light and the second light emitting element groups 11 for emitting the first light are disposed alternately, the light emitting device 1 may emit light having high color mixability.

Further, since the first phosphors 4a in the first light emitting element groups 10 are disposed among the facing side surfaces and the upper surfaces of the light emitting elements 3, the amount of the first phosphors 4a disposed on the upper surface of the light emitting elements 3 is reduced, and heat from the first phosphors 4a is reduced, and the possibility for decreasing the luminous efficiency by heating an area around the light emitting elements 3 is reduced, and therefore the luminous efficiency may increase.

Further, in the light emitting device 1, since all of the plurality of first light emitting element groups 10 and the plurality of second light emitting element groups 11 are disposed in a straight line in the same direction, the light emitting elements 3 are connected without intersecting the bonding wires which connects among the light emitting elements 3 included in the first light emitting element groups 10 and the second light emitting element groups 11.

Further, in the light emitting device 1, since the jumper Bx connects the second wiring pattern 34 with the second wiring pattern 35, the bonding wires for connecting among the light emitting elements 3 mounted on the mounting area 9 may be disposed so as not to intersect each other. In the light emitting device 1, since the bonding wires for connecting the light emitting element 3 mounted on the mounting area 9 are disposed so as not to intersect each other, short circuits via the bonding wire are prevented.

Further, in the light emitting device 1, since the jumper Bx is disposed at a position for connecting the second light emitting element group 11 included in the second light emitting element row 38, only the current flowing through the second light emitting element row 38 flows though the jumper Bx, and current flowing through the second light emitting element row 37 does not flow though the jumper Bx. Since only the current flowing through the second light emitting element row 38 flows though the jumper Bx whose resistance value is larger than those of the first wiring patterns 21 to 23 and the second wiring patterns 31 to 35, an increase in power consumption due to the current flowing through the jumper Bx may be suppressed.

(Light Emitting Device According to the Second Embodiment)

Figure 6:
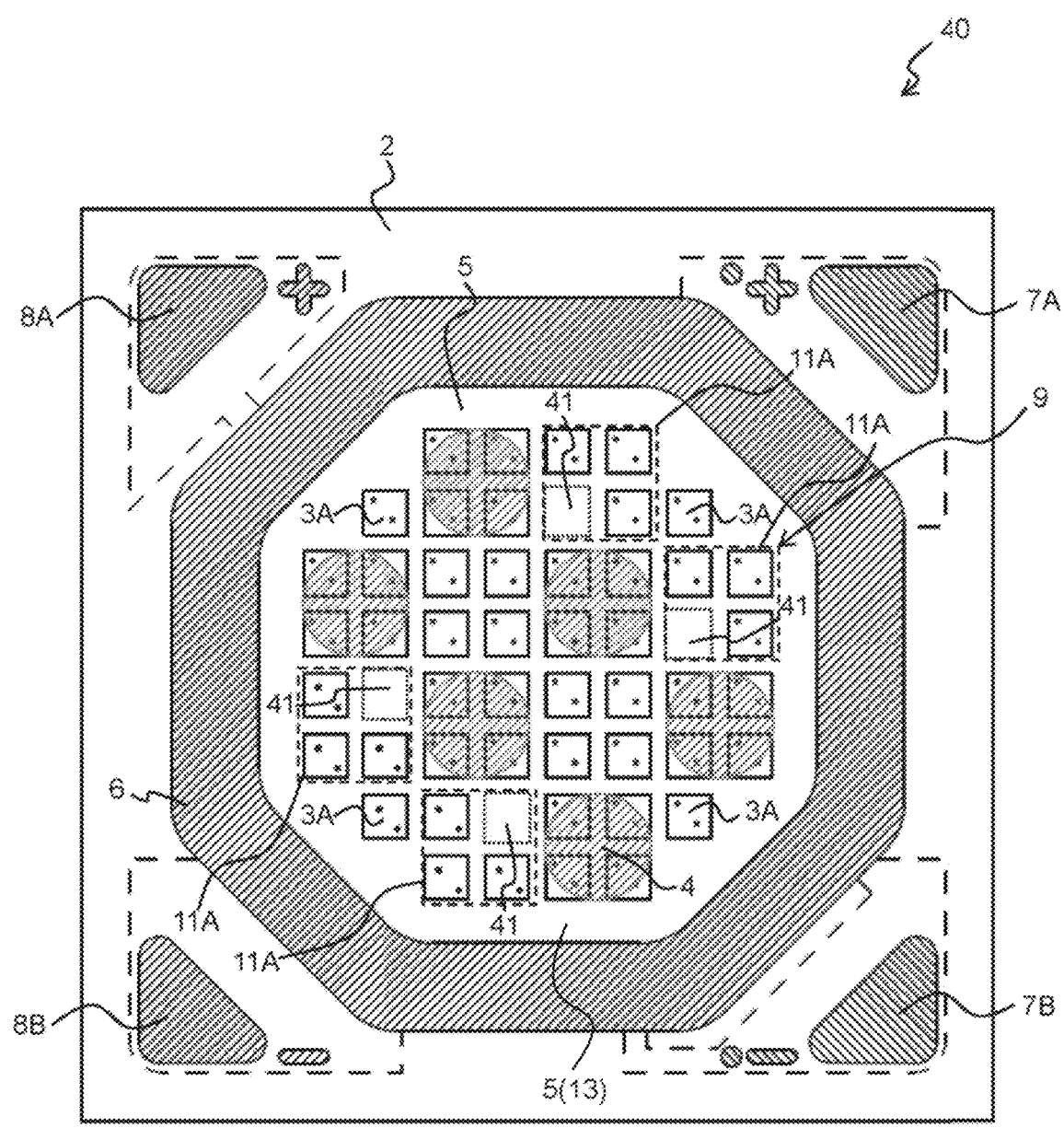
FIG. 6 is a plan view of a light emitting device according to a second embodiment.

FIG. 6 is a plan view of a light emitting device according to a second embodiment. Bonding wires are omitted in FIG. 6.

A disposition of the light emitting element 3 included in the second light emitting element group 11 in a light emitting device 40 is different from that of the light emitting device 1. Since the configuration and functions of the components of the light emitting device 40 other than the disposition of the light emitting elements 3 included in the second light emitting element group 11 are the same as those of the light emitting device 1 having the same reference numerals, a detailed description thereof will be omitted.

In the light emitting device 40, the second mounting areas 11A are disposed adjacent to the dam material 6, a gap 41 where no light emitting element 3 are disposed is formed in each of the second mounting areas 11A where the light emitting elements 3 included in the second light emitting element groups 11 are disposed. In the light emitting device 40, light emitting elements 3A corresponding to a light emitting element 3 disposed at a position corresponding to the gap 41 in the light emitting device 1 is disposed in an area between the outer edge of the first mounting area 10A and the mounting area 9.

Figure 7:
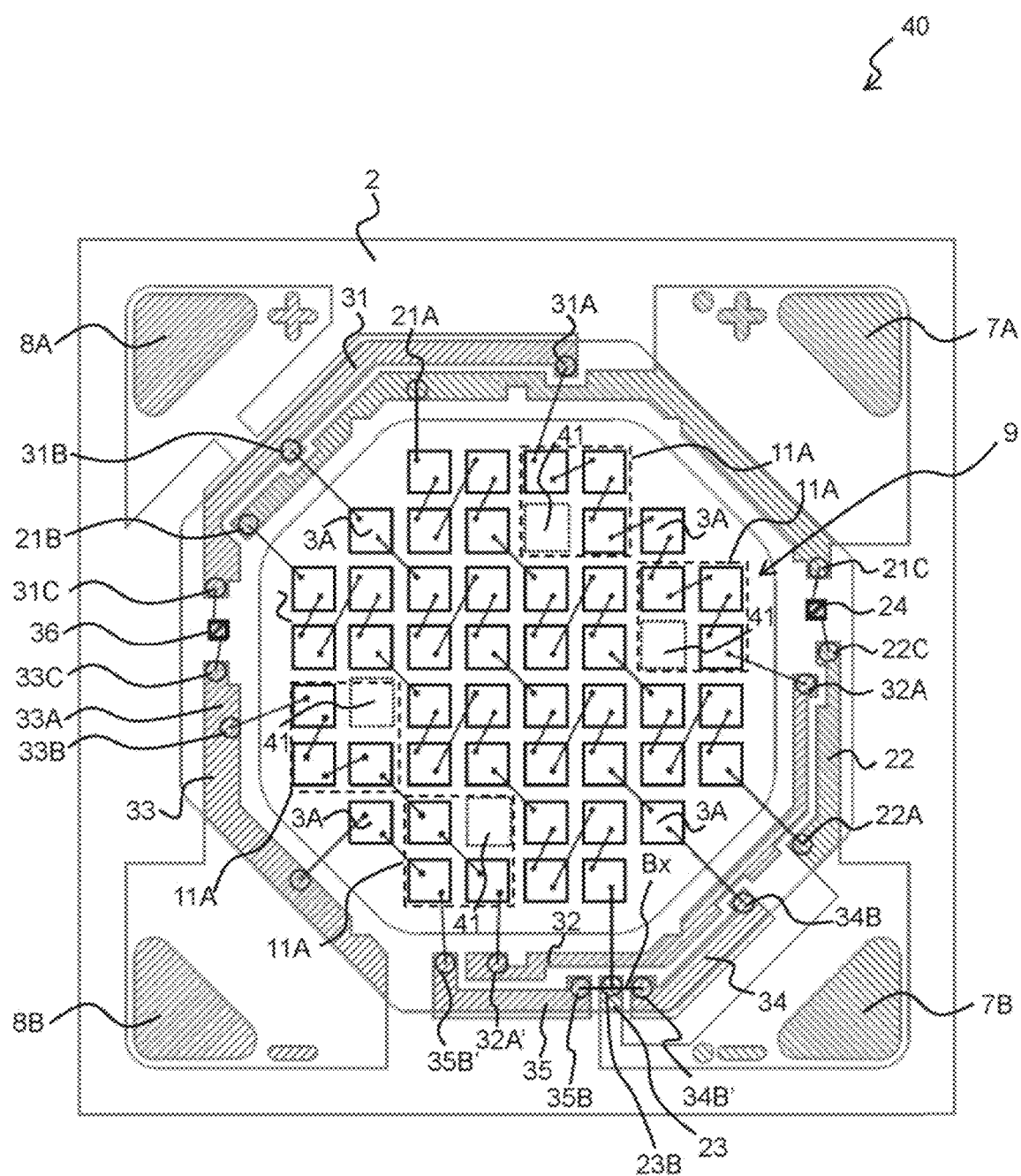
FIG. 7 is a plan view of a light emitting device shown in FIG. 6 omitting the sealing material and the dam material.

FIG. 7 is a plan view of a light emitting device 40 omitting the sealing material 5 and the dam material 6.

In the light emitting device 40, since the light emitting elements 3A are disposed in the area between the outer edge of the first mounting area 10A and the mounting area 9, a connection relationship among the light emitting elements 3 included in the second light emitting element rows 37 and 38 is different from the connection relationship in the light emitting device 1.
(Effect of the Light Emitting Device According to the Second Embodiment)

In the light emitting device 40, the disposition shape of the light emitting elements 3 included in the second light emitting element groups 11 may be close to the shape of the mounting area 9, by disposing the light emitting elements 3A in the region between the outer edge of the first mounting area 10A and the mounting area 9. Since the disposition shape of the light emitting element 3 in the light emitting device 40 is close to the shape of the mounting area 9, the light emitting device 40 may emit light having less color and brightness irregularities and improved uniformity, in addition to effects explained relating to the light emitting device 1.

(Light Emitting Device According to a First Modification)

Figure 8:
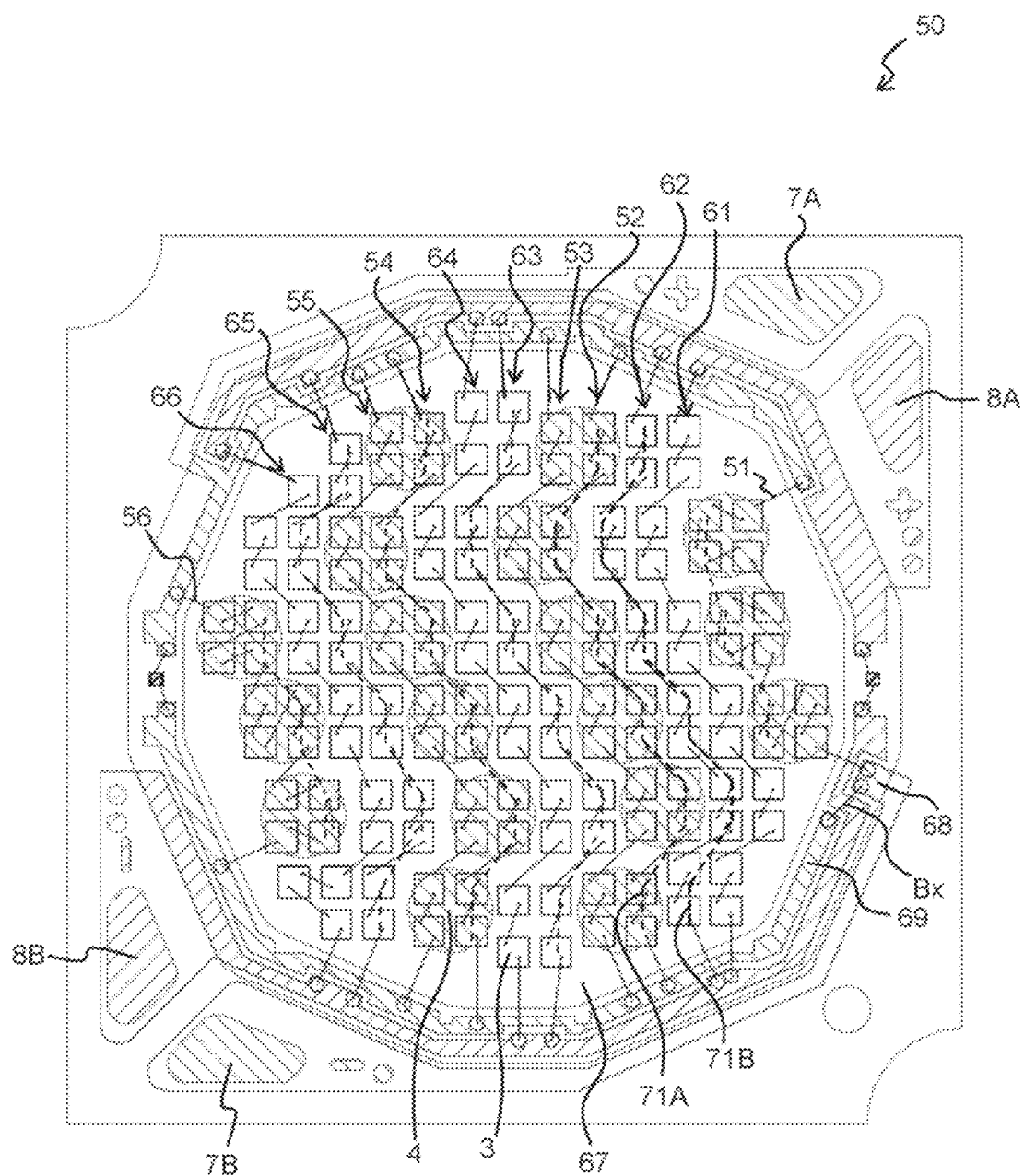
FIG. 8 is a plan view of a light emitting device according to a first modification of the first embodiment.
Figure 9:
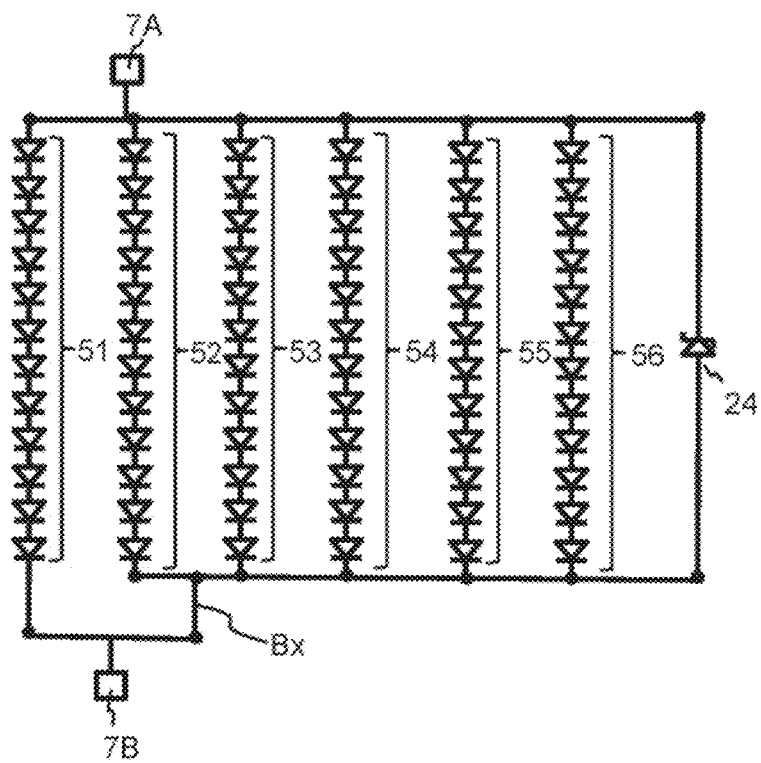
FIG. 9 is a circuit diagram of a light emitting device shown in FIG. 8.
Figure 9:
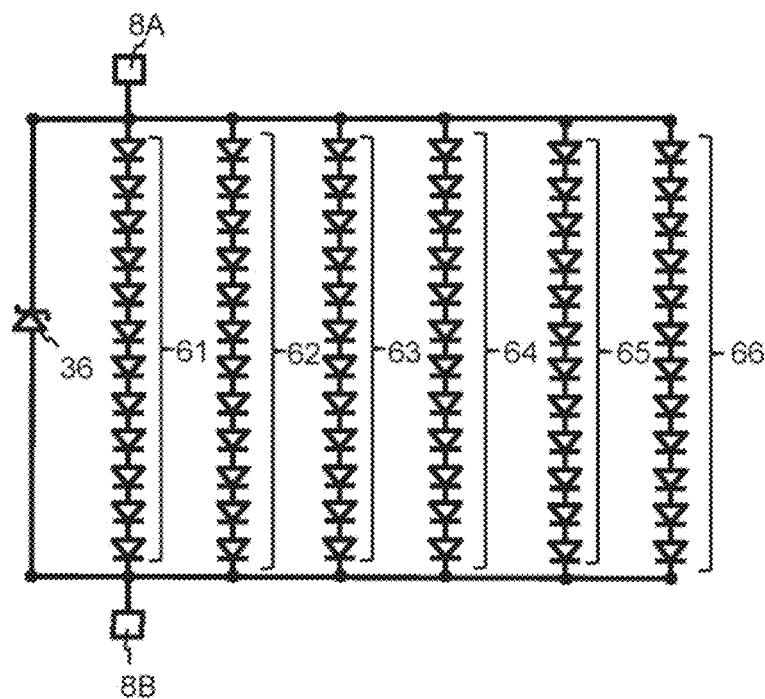

FIG. 8 is a plan view of a light emitting device according to a first modification of the first embodiment, and FIG. 9 is a circuit diagram of a light emitting device shown in FIG. 8. A sealing material and a dam material are omitted in FIG. 8.

A light emitting device 50 differs from the light emitting device 1 in that the light emitting device 50 has first light emitting element rows 51 to 56 and second light emitting element rows 61 to 66 in place of first light emitting element rows 25 and 26 and second light emitting element rows 37 and 38. Further, in the light emitting device 50, a planar shape of the mounting area 67 for mounting the light emitting element 3 is substantially 12 square shape, and differs from the planar shape of the mounting area 9. Since the components and functions of the light emitting device 50 other than the first light emitting element rows 51 to 56 and the second light emitting element rows 61 to 66 and the planar shapes of the mounting area 67 are the same as those of the light emitting device 1 having the same reference numerals, a detailed description thereof will be omitted. In a substrate in the light emitting device 50, notches for screwing the light emitting device 50 are formed at a pair of opposing corners in which the first electrode pair 7A and 7B and the second electrode pair 8A and 8B are not disposed.

The light emitting elements 3 included in a first light emitting element row 52 and the light emitting elements 3 included in a second light emitting element row 62 are disposed in a zigzag manner along the extending directions of the two polygonal lines 71A and 71B parallel to each other and adjacent to each other. The light emitting elements 3 included in a first light emitting element row 53 and second light emitting element row 63 are disposed in a zigzag manner along the extending direction of the two polygonal lines parallel to each other and adjacent to each other. Similarly, the light emitting elements 3 included in each of a first light emitting element row 54 and second light emitting element row 64 and the first light emitting element row 55 and the second light emitting element row 65 are disposed in a zigzag manner along an extending direction of two polygonal lines parallel to and adjacent to each other. In the light emitting device 50, the light emitting elements 3 included in the first light emitting element rows 51 to 56 and the second light emitting element rows 61 to 66 are disposed in a zigzag manner in the same direction, and therefore short circuits among bonding wires connecting the light emitting elements 3 are prevented.

Further, in the light emitting device 50, a jumper Bx connects the first wiring patterns 68 and 69 which electrically connect the first light emitting element rows 51 to 56 and the first electrode pair 7A and 7B. In the light emitting device 50, short circuits among the bonding wires connecting the light emitting element 3 are prevented, and the color mixability of emitting light may be improved, by connecting the first wiring pattern 68 and 69 via a jumper Bx.

(Light Emitting Device According to a Second Modification)

Figure 10:
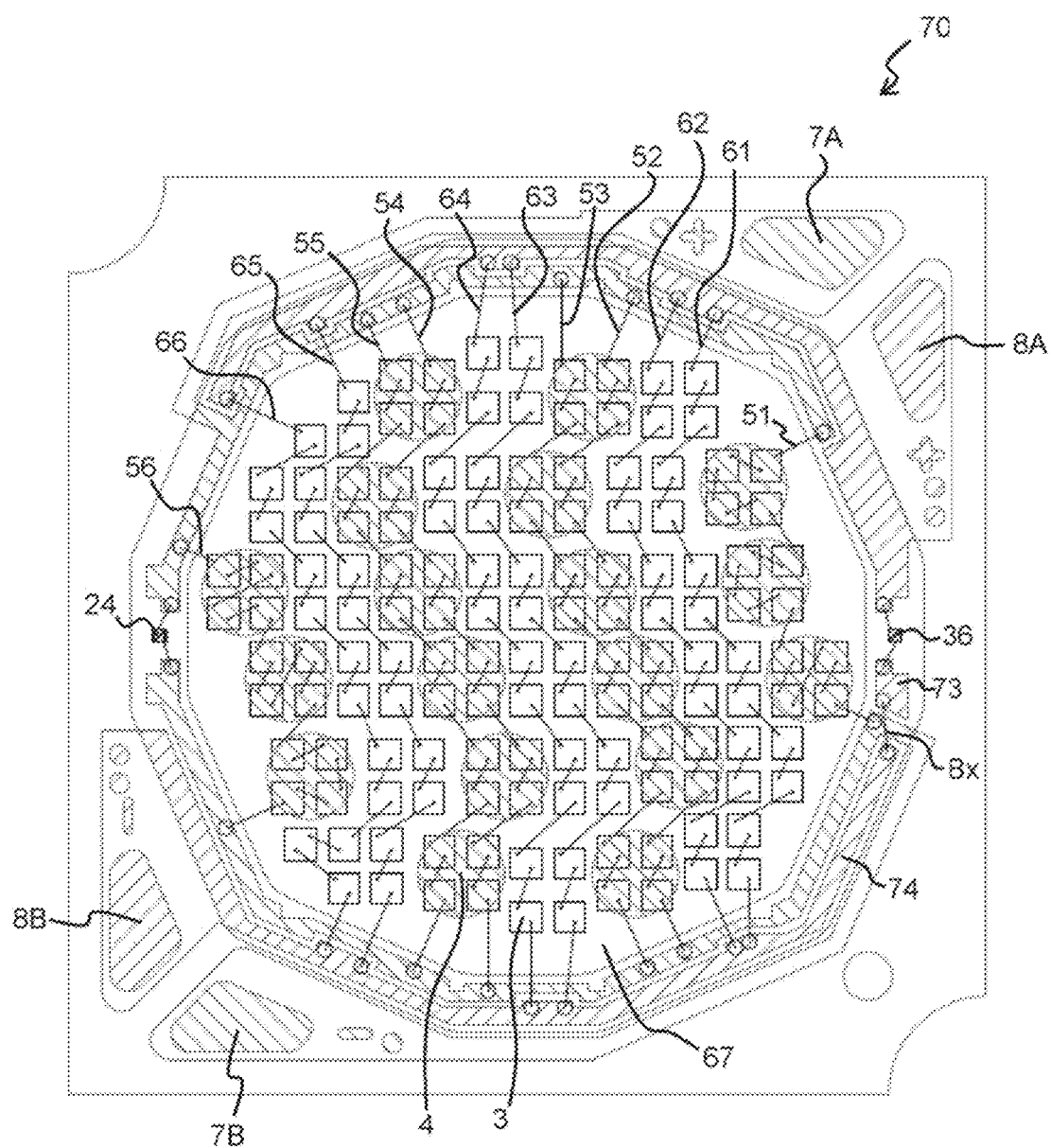
FIG. 10 is a plan view of a light emitting device according to a second modification of the first embodiment.
Figure 11:
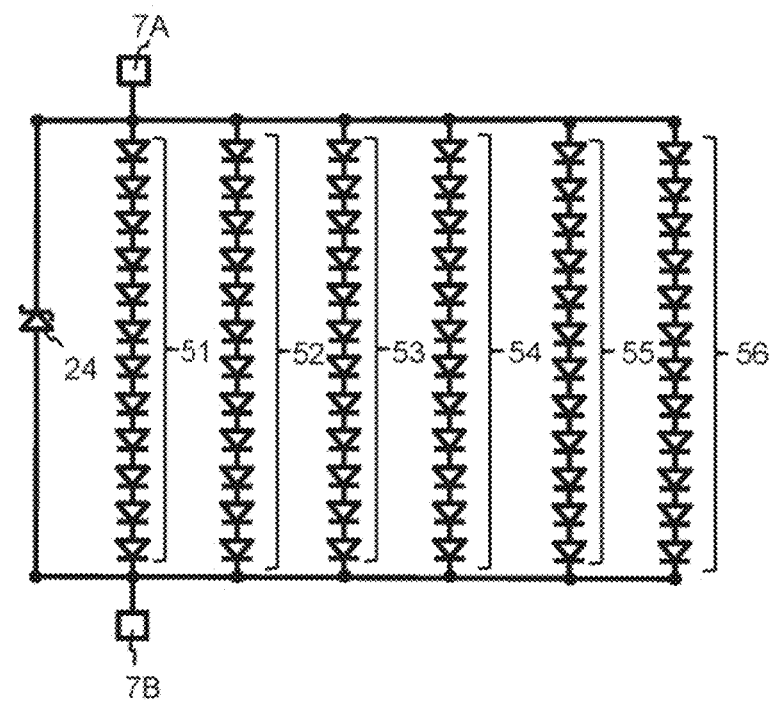
FIG. 11 is a circuit diagram of the light emitting device shown in FIG. 10.
Figure 11:
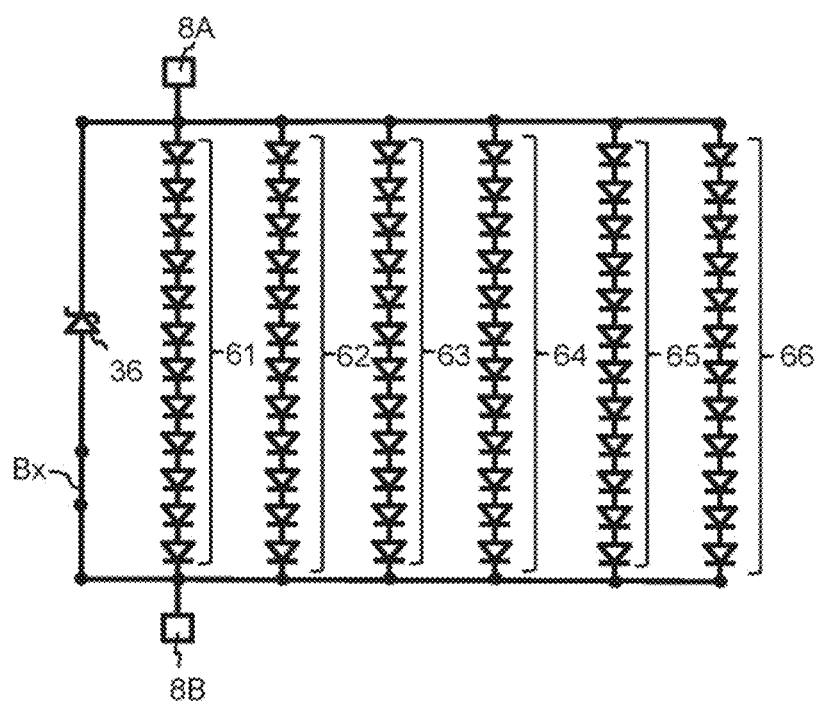

FIG. 10 is a plan view of a light emitting device according to a second modification of the first embodiment, FIG. 11 is a circuit diagram of the light emitting device shown in FIG. 10. A sealing material and a dam material are omitted in FIG. 10.

The disposition of the jumper Bx in a light emitting device 70 is different from that of the light emitting device 50. Since the elements and functions of the light emitting device 70 other than the disposition of the jumper Bx are the same as those of the light emitting device 50 having the same reference numerals, a detailed description thereof will be omitted.

In the light emitting device 70, a jumper Bx connects the second wiring pattern 73 and 74 which connect the second electrode pair 8A and 8B with the second overvoltage preventing element 36.

In the light emitting device 70, since the jumper Bx is connected in series with the second overvoltage preventing element 36, no currents flow through the jumper Bx except when an overvoltage is applied between the second electrode pair 8A and 8B and the second overvoltage preventing element 36 is turned on. In the light emitting device 70, no currents flow through the jumper Bx while the light emitting elements 3 included in the first light emitting element rows 51 to 56 and the second light emitting element rows 61 to 66 emit light, and no powers by flowing through the jumper Bx are consumed.

(Light Emitting Device According to a Third Modification)

Figure 12:
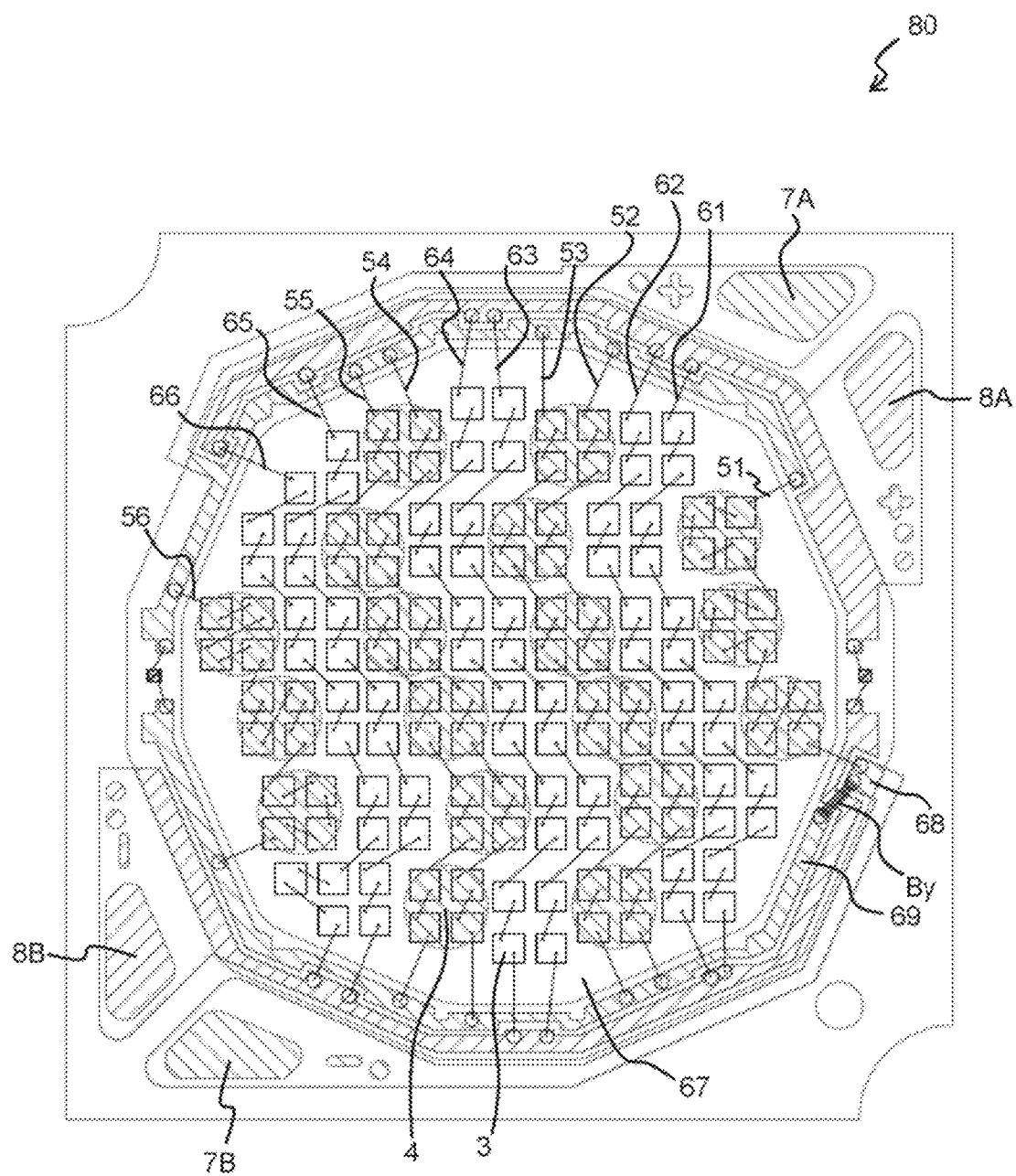
FIG. 12 is a plan view of a light emitting device according to a third modification of the first embodiment.
Figure 13:
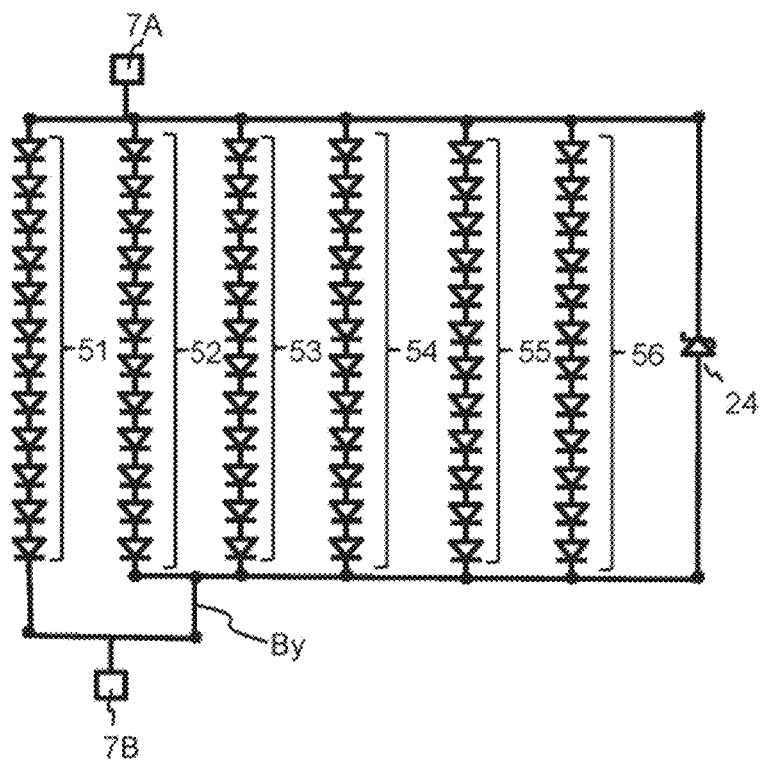
FIG. 13 is a circuit diagram of a light emitting device shown in FIG. 12.
Figure 13:
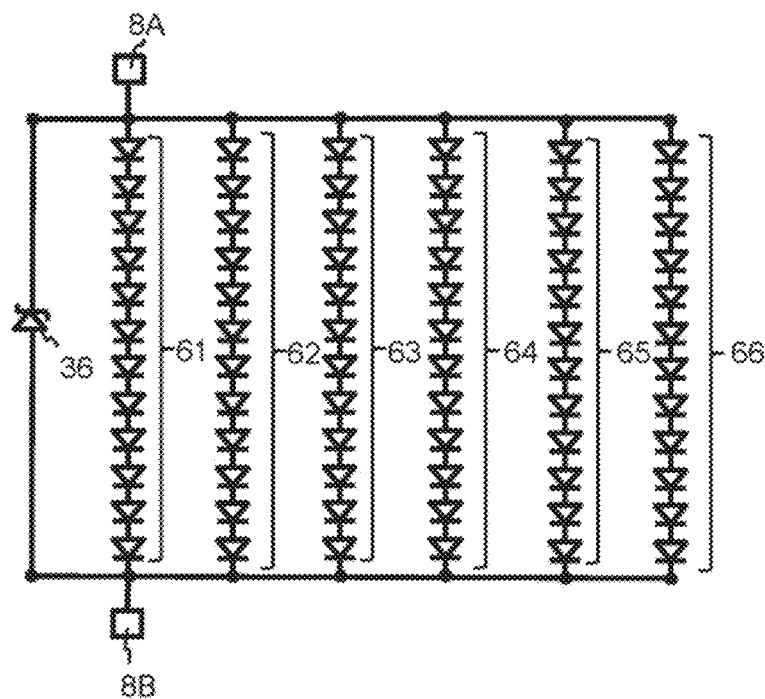

FIG. 12 is a plan view of a light emitting device according to a third modification of the first embodiment, and FIG. 13 is a circuit diagram of a light emitting device shown in FIG. 12. A sealing material and a dam material is omitted in FIG. 12.

A light emitting device 80 differs from the light emitting device 50 in that the light emitting device 80 has a jumper By in place of the jumper Bx. Since the elements and functions of the light emitting device 80 other than the jumper By are similar to those of the light emitting device 50 having the same reference numerals, a detailed description thereof will be omitted.

The jumper By includes a plurality of bonding wires connected in parallel, and therefore a resistance value of bonding wires is lower than that of the jumper Bx formed by a single bonding wire. In the light emitting device 80, the jumper By having a lower resistance value than that of the jumper Bx connects the first wiring patterns 68 and 69, and therefore a power consumption when a current flows through the jumper Bx in the light emitting device 80 is lower than that of the light emitting device 50.

Although the jumper By is formed by a plurality of bonding wires connected in parallel, the jumper By may be a single bonding wire having a larger sectional area than that of bonding wires connecting between the light emitting elements 3.

Further, in the light emitting device according to the embodiment, phosphors may be disposed so as to cover at least a portion of at least a portion of the upper surfaces of at least two light emitting elements of the plurality of light emitting elements and at least a portion of facing side surface of at least two light emitting elements.

Further, in the light emitting device according to the embodiment, phosphors may be disposed so as not to cover at least a portion of the side surfaces that does not face the at least two light-emitting elements.

(Light Emitting Device According to a Fourth Modification)

Figure 14:
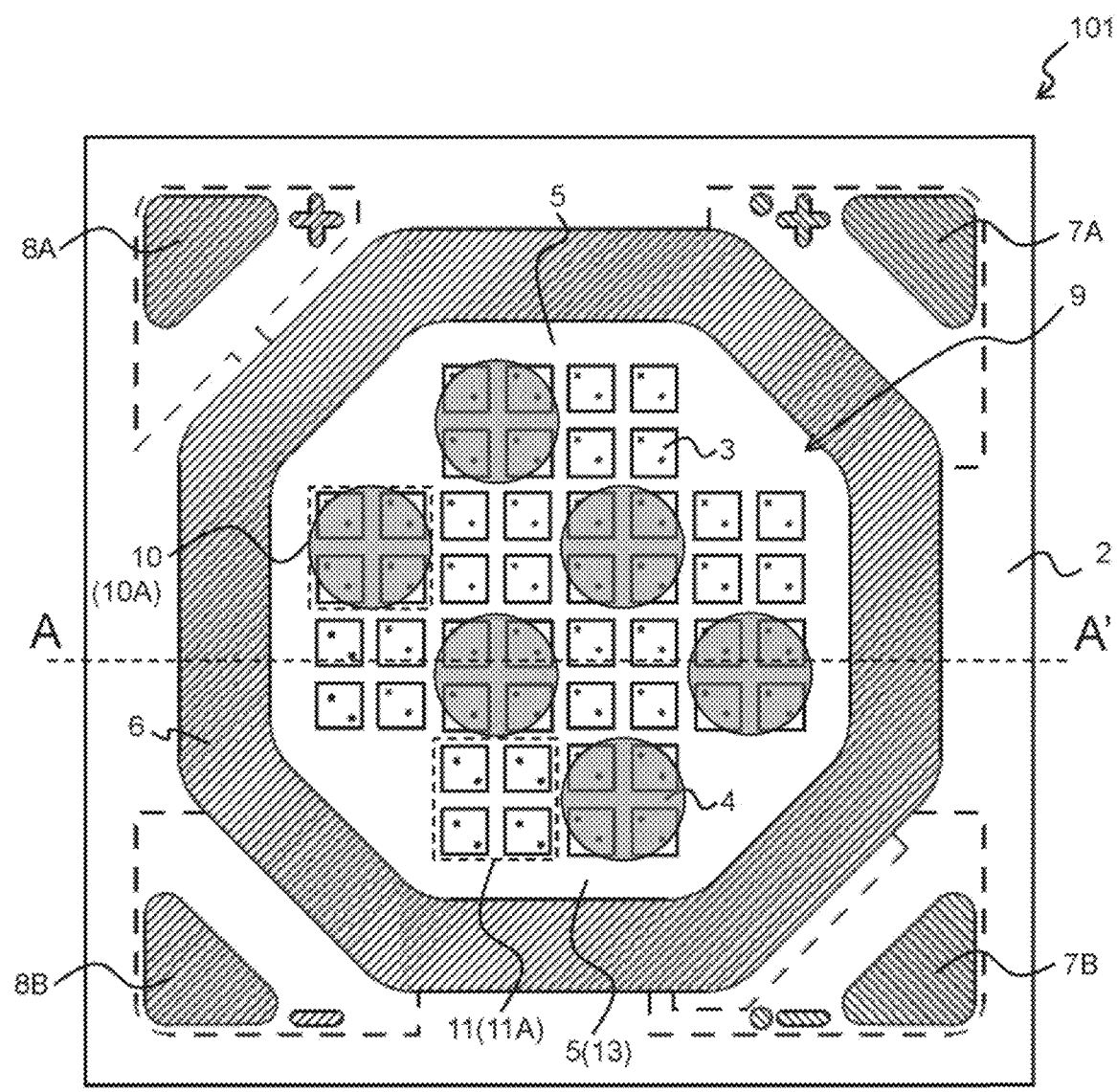
FIG. 14 is a plan view of a light emitting device according to a fourth modification of the first embodiment.
Figure 15A:
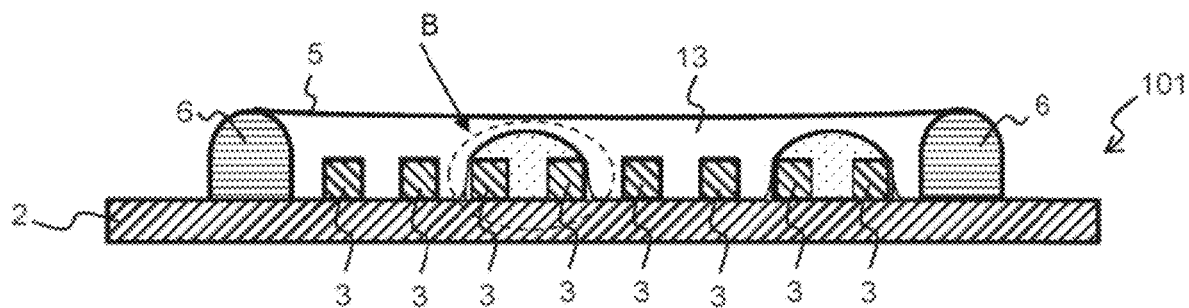
FIG. 15A is a sectional view taken along A-A' of the light emitting device shown in FIG. 14.
Figure 15B:
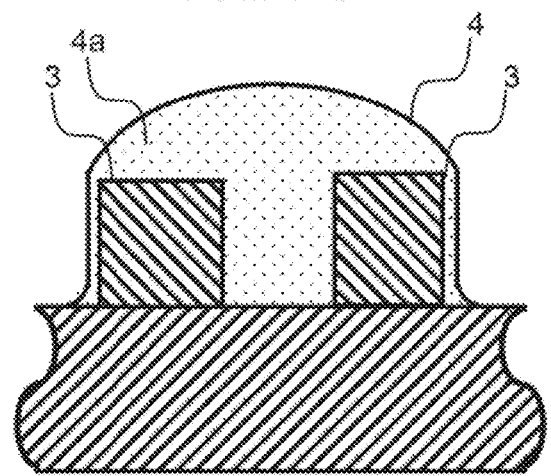
FIG. 15B is a portion enlarged view shown by an arrow B in FIG. 15A.
Figure 15C:
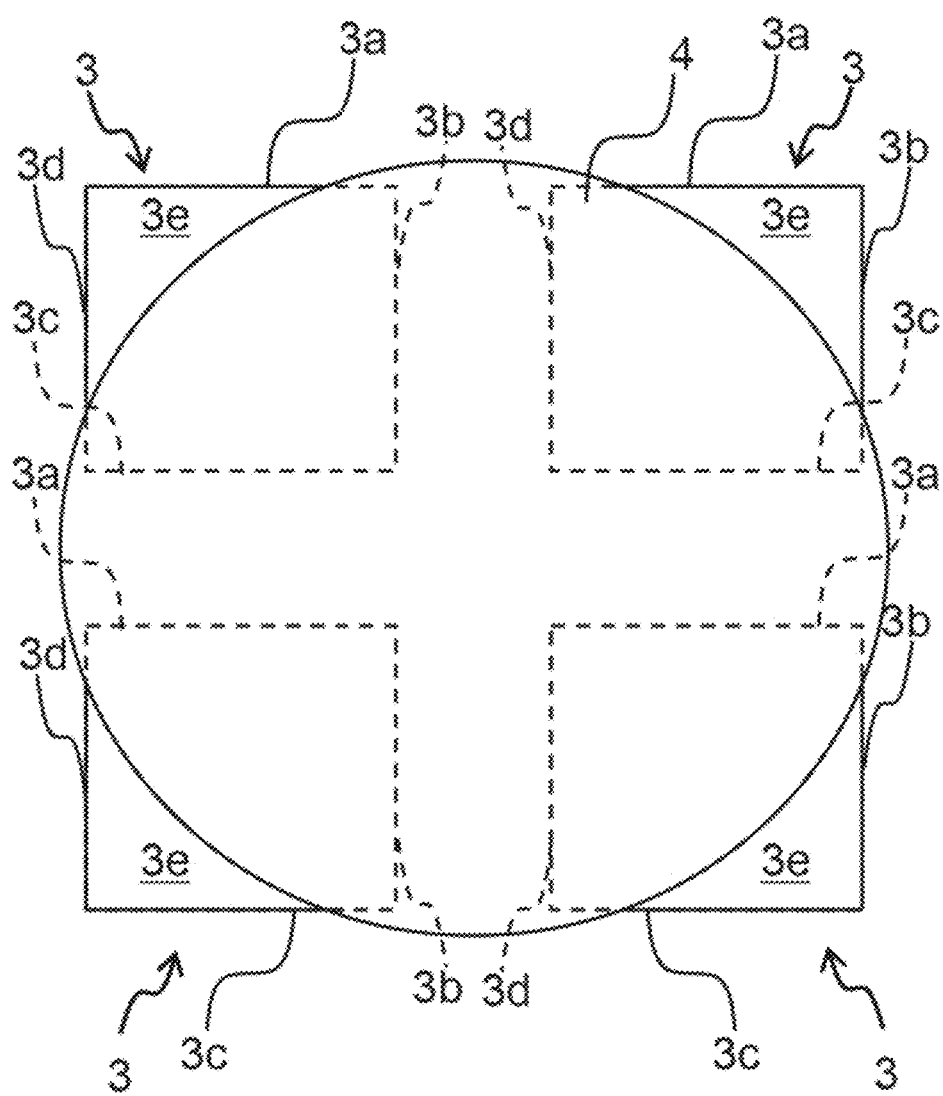
FIG. 15C is a plan view of the light emitting device shown in FIG. 14.

FIG. 14 is a plan view of a light emitting device according to a fourth modification of the first embodiment, FIG. 15A is a sectional view taken along A-A' of the light emitting device shown in FIG. 14, FIG. 15B is a portion enlarged view shown by an arrow B in FIG. 15A, and FIG. 15C is a plan view of the light emitting device shown in FIG. 14.

A disposition area in which the first phosphor including resin 4 is disposed in a light emitting device 101 is different from that of the light emitting device 1. Since the configuration and functions of the elements of the light emitting device 101 other than the disposition area in which the first phosphor including resin 4 is disposed are the same as those of the light emitting device 1 having the same reference numerals, a detailed description thereof will be omitted.

In the light emitting device 101, the first phosphor including resin 4 is disposed so as to cover a portion of the side surfaces that does not face the four light emitting elements 3 included in the first light emitting element groups 10. More specifically, in the side surfaces adjacent to the facing side surfaces of the four light emitting elements 3 of the light emitting device 101, the first phosphor including resin 4 are disposed so as to cover the vicinity of the sides adjacent to the facing side surfaces of the four light emitting elements 3.

In FIG. 15C, the phosphor including resin 4 is disposed so as to cover all of the second side surface 3b and the third side surface 3c of the light emitting element 3 on the upper left portion, the vicinity of a side of the first side surface 3a between the first side surface 3a and the second side surface 3b, and the vicinity of a side of the fourth side surface 3d between the third side surface 3c and the forth side surface 3d. The phosphor including resin 4 is disposed so as to cover all of the third side surface 3c and the fourth side surface 3d of the light emitting element 3 on the upper right portion, the vicinity of a side of the first side surface 3a between the first side surface 3a and the forth side surface 3d, and the vicinity of a side of the second side surface 3b between the third side surface 3c and the second side surface 3b. The phosphor including resin 4 is disposed so as to cover all of the first side surface 3a and the fourth side surface 3d of the light emitting element 3 on the lower right portion, the vicinity of a side of the second side surface 3b between the first side surface 3a and the second side surface 3b, and the vicinity of a side of the third side surface 3c between the third side surface 3c and the forth side surface 3d. The phosphor including resin 4 is disposed so as to cover all of the first side surface 3a and the second side surface 3b of the light emitting element 3 on the lower left portion, the vicinity of a side of the fourth side surface 3d between the first side surface 3a and the forth side surface 3d, and the vicinity of a side of the third side surface 3c between the third side surface 3c and the second side surface 3b.

Further, in the light emitting device 101, the first phosphor including resin 4 are disposed on a part of the upper surfaces of each of the four light emitting elements 3 included in the first light emitting element groups 10. More specifically, in the light emitting device 101, the first phosphor including resin 4 are disposed so as not to cover the vicinity of corners on the upper surfaces 3e of the four light emitting elements 3 most apart from the facing side surfaces of the four light emitting elements 3.

In FIG. 15C, in the upper surfaces 3e of the light emitting element 3 on the upper left portion, the phosphor including resin 4 is disposed so as not to cover the vicinity of a corner between the first side surface 3a and the forth side surface 3d on the upper surfaces of the four light emitting elements 3 most apart from the facing side surfaces of the four light emitting elements 3. In the upper surfaces 3e of the light emitting element 3 on the upper right portion, the phosphor including resin 4 is disposed so as not to cover the vicinity of a corner between the first side surface 3a and the second side surface 3b on the upper surfaces of the four light emitting elements 3 most apart from the facing side surfaces of the four light emitting elements 3. In the upper surfaces 3e of the light emitting element 3 on the lower right portion, the phosphor including resin 4 is disposed so as not to cover the vicinity of a corner between the second side surface 3b and the third side surface 3c on the upper surfaces of the four light emitting elements 3 most apart from the facing side surfaces of the four light emitting elements 3. In the upper surfaces 3e of the light emitting element 3 on the lower left portion, the phosphor including resin 4 is disposed so as not to cover the vicinity of a corner between the third side surface 3c and the forth side surface 3d on the upper surfaces of the four light emitting elements 3 most apart from the facing side surfaces of the four light emitting elements 3.

(Light Emitting Device According to a Fifth Modification)

Figure 16:
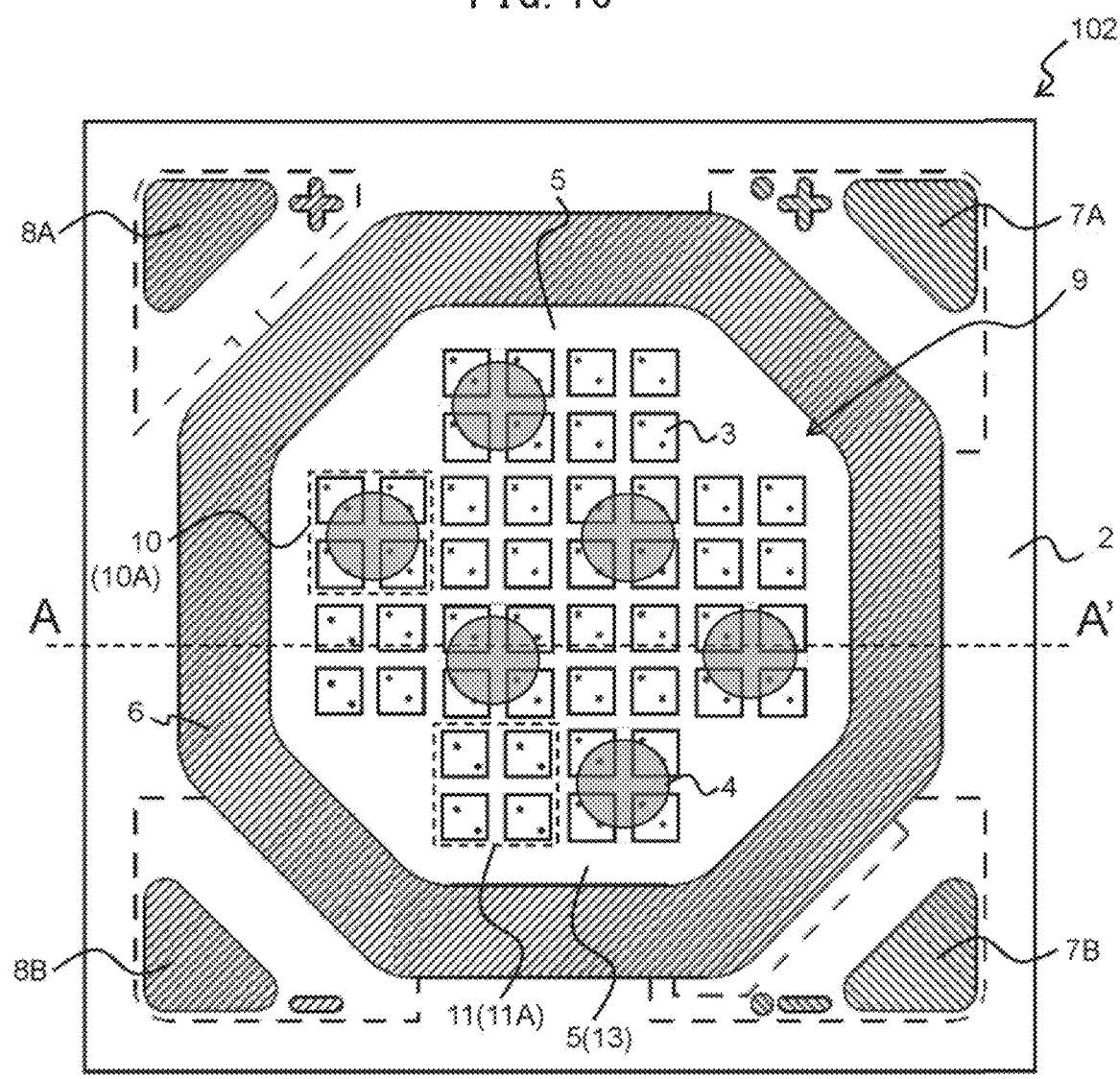
FIG. 16 is a plan view of a light emitting device according to a fifth modification of the first embodiment.
Figure 17A:
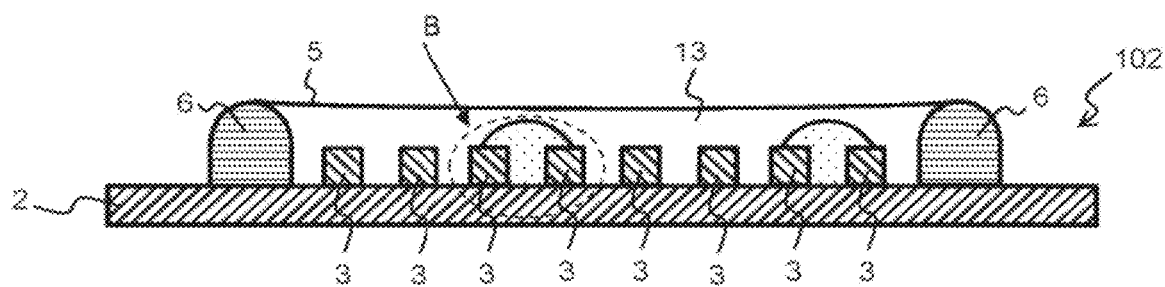
FIG. 17A is a sectional view taken along A-A' of the light emitting device shown in FIG. 16.
Figure 17B:
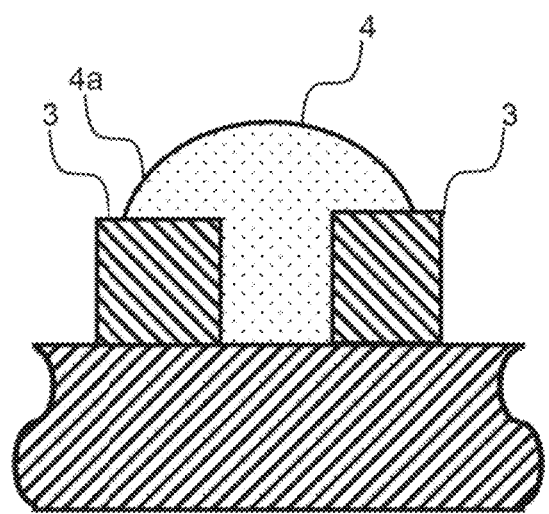
FIG. 17B is a portion enlarged view shown by an arrow B in FIG. 17A.
Figure 17C:
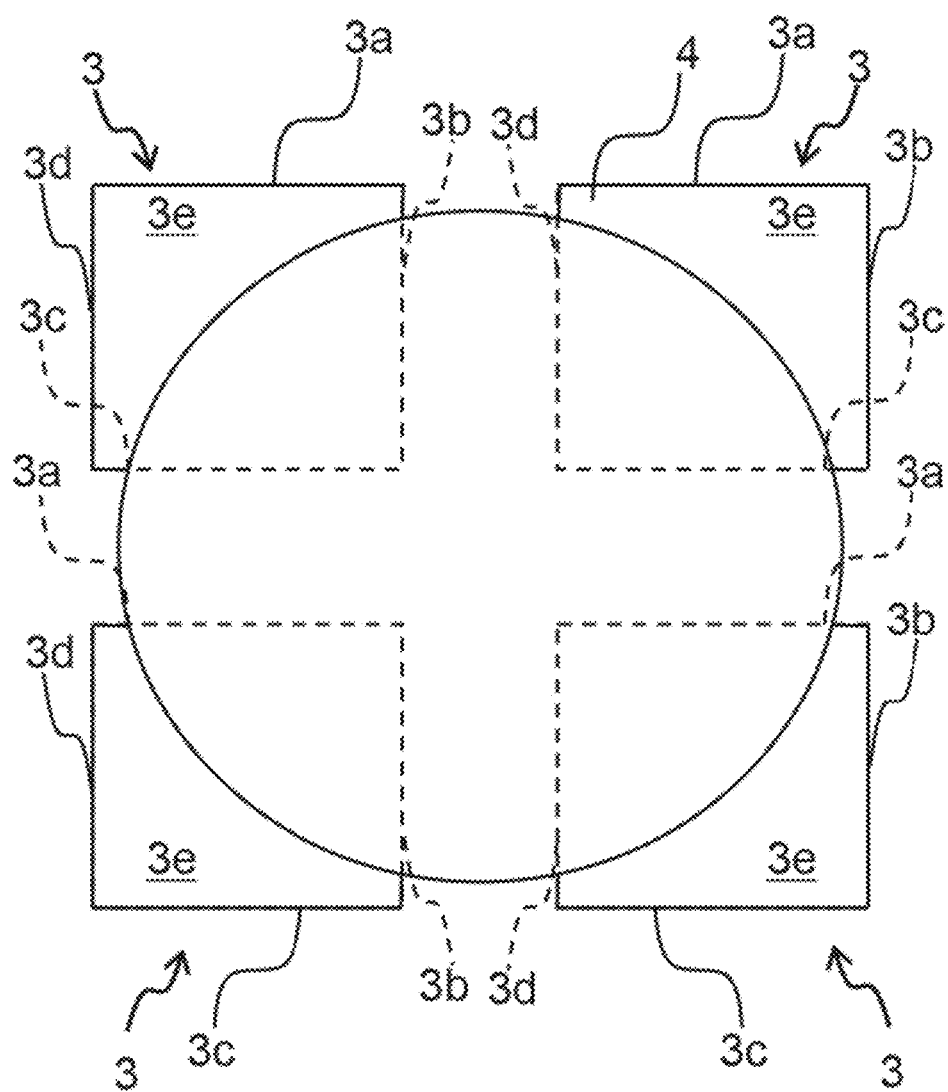
FIG. 17C is a plan view of the light emitting device shown in FIG. 16.

FIG. 16 is a plan view of a light emitting device according to a fifth modification of the first embodiment, FIG. 17A is a sectional view taken along A-A' of the light emitting device shown in FIG. 16, FIG. 17B is a portion enlarged view shown by an arrow B in FIG. 17A, and FIG. 17C is a plan view of the light emitting device shown in FIG. 16.

Similarly to the light emitting device 101, the disposition area in which the first phosphor including resin 4 are disposed in a light emitting device 102 is different from that of the light emitting device 1. Since the configuration and functions of the elements of the light emitting device 102 other than the disposition area in which the first phosphor including resin 4 are disposed are the same as those of the light emitting device 1 having the same reference numerals, a detailed description thereof will be omitted.

In the light emitting device 102, the first phosphor including resin 4 are disposed so as to cover a portion of each of facing side surfaces of the four light emitting elements 3 included in the first light emitting element groups 10. More specifically, in the light emitting device 102, the first phosphor including resin 4 are disposed so as not to cover the vicinity of the side disposed on the outside in the facing side surfaces of the four light emitting elements 3.

In FIG. 17C, in the second side surface 3b of the light emitting element 3 on the upper left portion facing the fourth side surface 3d of the light emitting element 3 on the upper right portion, the phosphor including resin 4 is disposed so as not to cover the vicinity of a side between the second side surface 3b and the first side surface 3a disposed outside of the second side surface 3b. Further, in the third side surface 3c of the light emitting element 3 on the upper left portion facing the first side surface 3a of the light emitting element 3 on the lower left portion, the phosphor including resin 4 is disposed so as not to cover the vicinity of a side between the third side surface 3c and the fourth side surface 3d disposed outside of the third side surface 3c. In the third side surface 3c of the light emitting element 3 on the upper right portion facing the first side surface 3a of the light emitting element 3 on the lower right portion, the phosphor including resin 4 is disposed so as not to cover the vicinity of a side between the third side surface 3c and the second side surface 3b disposed outside of the third side surface 3c. Further, in the fourth side surface 3d of the light emitting element 3 on the upper right portion facing the second side surface 3b of the light emitting element 3 on the upper left portion, the phosphor including resin 4 is disposed so as not to cover the vicinity of a side between the fourth side surface 3d and the first side surface 3a disposed outside of the fourth side surface 3d.

In the fourth side surface 3d of the light emitting element 3 on the lower right portion facing the second side surface 3b of the light emitting element 3 on the lower left portion, the phosphor including resin 4 is disposed so as not to cover the vicinity of a side between the fourth side surface 3d and the third side surface 3c disposed outside of the fourth side surface 3d. Further, in the first side surface 3a of the light emitting element 3 on the lower right portion facing the third side surface 3c of the light emitting element 3 on the upper right portion, the phosphor including resin 4 is disposed so as not to cover the vicinity of a side between the first side surface 3a and the second side surface 3b disposed outside of the first side surface 3a. In the first side surface 3a of the light emitting element 3 on the lower left portion facing the third side surface 3c of the light emitting element 3 on the upper left portion, the phosphor including resin 4 is disposed so as not to cover the vicinity of a side between the first side surface 3a and the fourth side surface 3d disposed outside of the first side surface 3a. Further, in the second side surface 3b of the light emitting element 3 on the lower left portion facing the second side surface 3b of the light emitting element 3 on the lower right portion, the phosphor including resin 4 is disposed so as not to cover the vicinity of a side between the second side surface 3b and the third side surface 3c disposed outside of the second side surface 3b.

Further, the light emitting device according to the embodiment may further have a transparent layer formed of the same material as a transparent resin such as a silicone resin containing the first wavelength conversion member, and disposed between the substrate 2 and the four light emitting element 3 and the first phosphor including resin 4 contained in and the first light emitting element group 10 and the sealing material 5.

(Light Emitting Device According to a Sixth Modification)

Figure 18A:
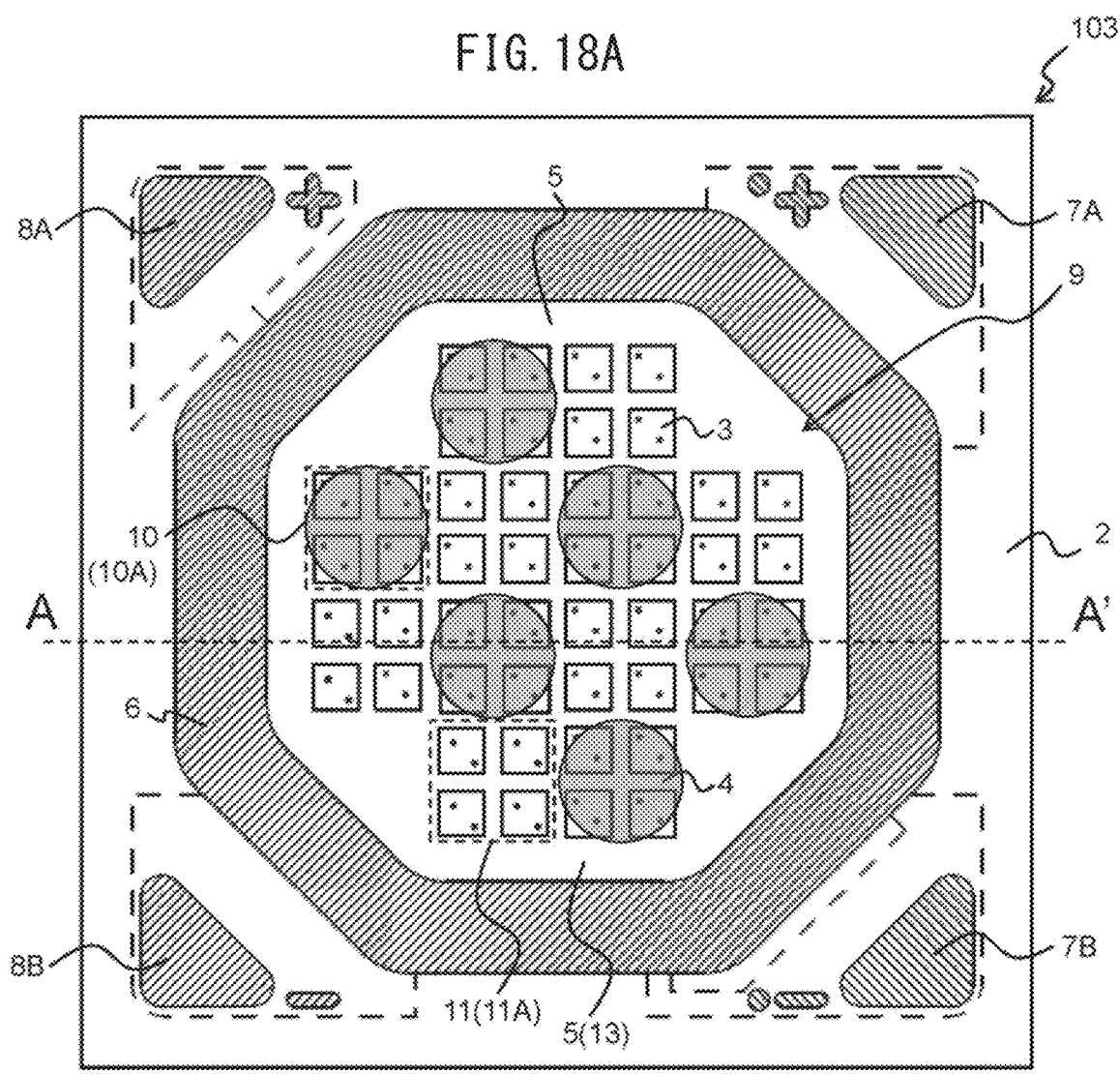
FIG. 18A is plan view of a light emitting device according to a sixth modification of the first embodiment.
Figure 18B:
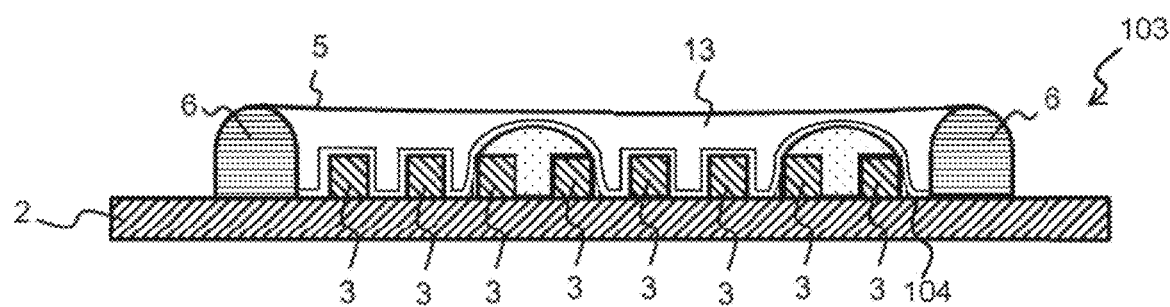
FIG. 18B is a sectional view taken along the line A-A' of the light emitting device shown in FIG. 18A.

FIG. 18A is a plan view of a light emitting device according to a sixth modification of the first embodiment, and FIG. 18B is a sectional view taken along the line A-A' of the light emitting device shown in FIG. 18A.

A light emitting device 103 differs from the light emitting device 101 in that a light emitting device 103 has a transparent layer 104. Since the components and functions of the light emitting device 103 other than the transparent layer 104 are the same as those of the light emitting device 101 having the same reference numerals, a detailed description thereof will be omitted.

The transparent layer 104 contains an acrylic resin, and a silicone resin, and is disposed between the substrate 2, the plurality of light emitting elements 3 and the first phosphor including resin 4, and the sealing material 5. The stiffness of the transparent layer 104 is higher than that of the first phosphor including resin 4 and the sealing member 5, and coats the substrate 2, the plurality of light emitting elements 3 and the first phosphor including resin 4 and the bonding wires over the entire surface. The thickness of the transparent layer 104 is 1 µm or more and 5 µm or less. Although the transparent layer 104 contains an acrylic resin, and a silicone resin, the transparent layer 104 further contains fluorine components, metallic oxide, and etc.

In the light emitting device 103, the reliability may be improved, since the transparent layer 104 coats the substrate 2, the plurality of light emitting elements 3, the first phosphor including resin 4 and the bonding wires.

In the light emitting device 103, a transparent layer 104 coats the substrate 2, the plurality of light emitting elements 3 and the first phosphor including resin 4 and the bonding wire over the entire surface. However, in the light emitting device according to the embodiment, the transparent layer 104 may be coated with at least a portion of each of the substrate 2, the plurality of light emitting elements 3, the first phosphor including resin 4 and the bonding wires.

(Light Emitting Device According to a Seventh Modification)

Figure 19A:
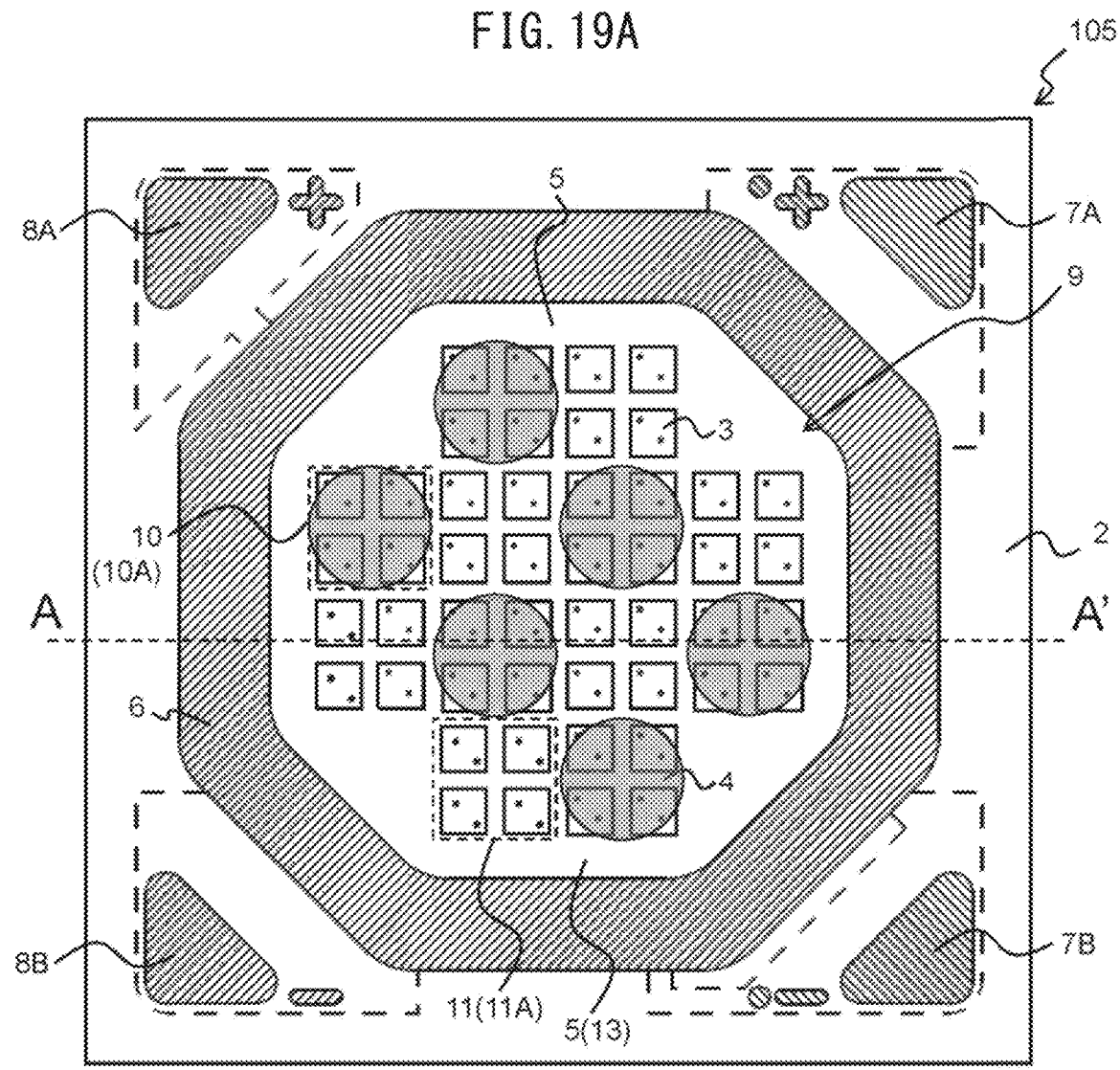
FIG. 19A is a plan view of a light emitting device according to a seventh modification.
Figure 19B:
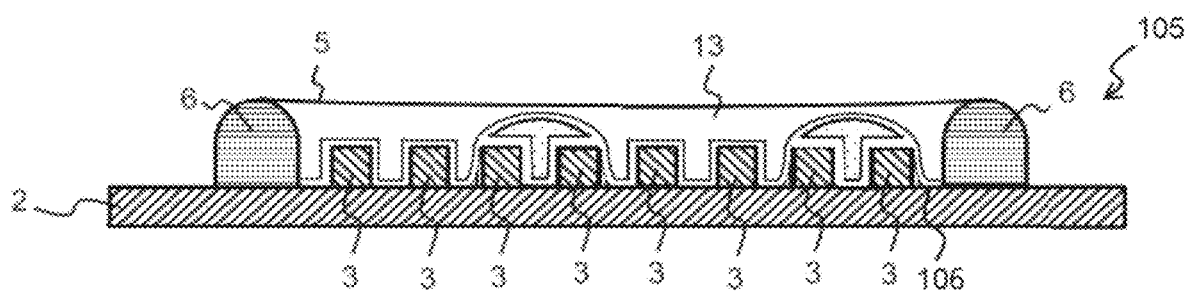
FIG. 19B is a sectional view taken along the line A-A' of the light emitting device shown in FIG. 19A.

FIG. 19A is a plan view of a light emitting device according to a seventh modification, and FIG. 19B is a sectional view taken along the line A-A' of the light emitting device shown in FIG. 19A.

A light emitting device 105 differs from the light emitting device 103 in that the light emitting device 105 has a transparent layer 106 in place of the transparent layer 104. Since the elements and functions of the light emitting device 105 other than the transparent layer 106 are the same as those of the light emitting device 105 having the same reference numerals, a detailed description thereof will be omitted.

Similarly to the transparency layer 104, the transparent layer 106 contains an acrylic resin, and a silicone resin, and is disposed between the substrate 2, the plurality of light emitting elements 3 and the bonding wires, and the first phosphor including resin 4 in addition to the substrate 2, the plurality of light emitting elements 3, the first phosphor including resin 4 and the bonding wires, and the sealing material 5.

In the light emitting device 105, since the transparent layer 106 coats the light emitting element 3 covered by the first phosphor including resin 4 in addition to the light emitting element 3 not covered by the first phosphor 4, reliability may be further improved.

In the light emitting device 105, a transparent layer 106 coats the substrate 2, the plurality of light emitting elements 3 and the first phosphor including resin 4 and the bonding wire over the entire surface. However, in the light emitting device according to the embodiment, the transparent layer 106 may be coated with at least a portion of each of the substrate 2, the plurality of light emitting elements 3 and the first phosphor including resin 4 and the bonding wires.

In the light emitting device 105, since the transparency layer 106 coats the substrate 2 over the entire surface, the substrate 2 may be prevented from being sulfurized by the sulfur component in air even when the transparent layer 106 is not coated with a part of the first phosphor including resin 4.

In the above explained light emitting devices according to the first embodiment, the second embodiment, and the first to seventh modifications, four light emitting elements disposed in an array are included. However, in the light emitting devices according to the first embodiment, the second embodiment, and the first to seventh modifications, the first light emitting element groups and the second light emitting element groups may include 2, 3 or 5 or more light emitting elements.

Figure 20A:
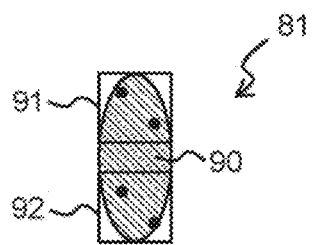
FIG. 20A is a diagram showing a first layout example of the disposition of the light emitting element groups and first phosphor including resin.
Figure 20B:
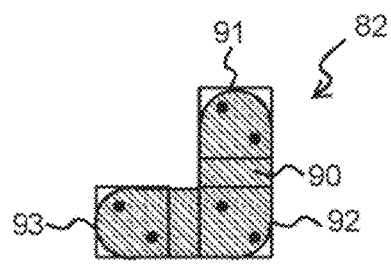
FIG. 20B is a diagram showing a second layout example of the disposition of the light emitting element groups and first phosphor including resin.
Figure 20C:
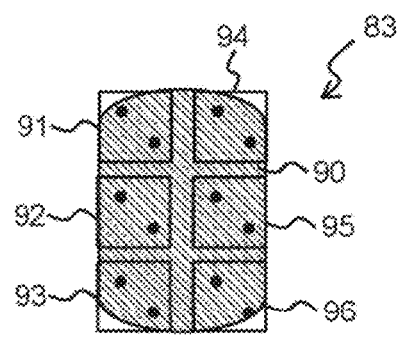
FIG. 20C is a diagram showing a third layout example of the disposition of the light emitting element groups and first phosphor including resin.

FIGS. 20A to 20C are diagrams showing layout example of the disposition of the light emitting element groups and first phosphor including resin in the light emitting devices according to the first embodiment, the second embodiment, and the first to seventh modifications, FIG. 20A shows a first layout example, FIG. 20B shows a second layout example, and FIG. 20C shows a third layout example.

In the first modification 81, the light emitting element groups 10 has two light emitting elements 91 and 92 which are similar to the light emitting element 3, a first phosphor including resin 90 which is similar to the first phosphor including resin 4 is disposed so as to cover at least a portion of the upper surface and the facing side surfaces of two light emitting elements 91 and 92, and not cover the non-facing side surfaces of the two light emitting elements. Although the first phosphor including resin 90 is disposed so as not to cover the non-facing side surfaces of the two light emitting elements, the first phosphor including resin 90 may be disposed so as to cover at least a portion of the non-facing side surfaces of the two light emitting elements.

In the second modification 82, the light emitting element groups 10 has three light emitting elements 91, 92 and 93 which are similar to the light emitting element 3, the first phosphor including resin 90 which is similar to the first phosphor including resin 4 is disposed so as to cover at least a portion of the upper surface and the facing side surfaces of the three light emitting elements 91, 92 and 93, and not cover the non-facing side surfaces of three light emitting elements. Although the first phosphor including resin 90 is disposed so as not to cover the non-facing side surfaces of the three light emitting elements, the first phosphor including resin 90 may be disposed so as to cover at least a portion of the non-facing side surfaces of the three light emitting elements.

In the third modification 83, the light emitting element groups 10 has six light emitting elements 91, 92, 93, 94, 95 and 96 which are similar to the light emitting element 3, the first phosphor including resin 90 is disposed so as to cover the top surface and the facing side surfaces of the four light emitting elements 91, 92, 93, 94, 95 and 96, and not cover the non-facing side surfaces of six light emitting elements. Although the first phosphor including resin 90 is disposed so as not to cover the non-facing side surfaces of the six light emitting elements, the first phosphor including resin 90 may be disposed so as to cover at least a portion of the non-facing side surfaces of the six light emitting elements.

In the above explained light emitting devices according to the first embodiment, the second embodiment, and the first to seventh modifications, all of the light emitting elements included in the first light emitting element groups and the second light emitting element groups are disposed such that the two side surfaces included in the same light emitting element groups face the side surfaces of the other light emitting elements. However, it is not necessary for all of the light emitting elements included in the first light emitting element groups and the second light emitting element groups in the light emitting device according to the embodiment to be disposed such that the two side surfaces included in the same light emitting element groups. It is necessary for at least one side surface of all of the plurality of light emitting elements included in the first light emitting element groups and the second light emitting element groups to be disposed so as to face the side surface of the other light emitting element included in the same light emitting element groups.

Further, in the light emitting devices 1 and 40, although the first light emitting element rows 25 and 26 include three first light emitting element groups 10, in the light emitting device according to the embodiment, the first light emitting element row 25 and 26 may include two or four or more first light emitting element groups. Further, in the light emitting devices 1 and 40, the second light emitting element rows 37 and 38 include three second light emitting element groups 22, but in the light emitting device according to the embodiment, the second light emitting element row may include two or four or more second light emitting element groups.

In the above explained light emitting devices according to the first embodiment, the second embodiment, and the first to seventh modifications, each of the first light emitting element groups and the second light emitting element groups are disposed in each of a plurality of first mounting areas having the same area. However, in the light emitting device according to the embodiment, each of the first light emitting element groups and the second light emitting element groups may be disposed in each of a plurality of first mounting areas having different areas.

In the above explained light emitting devices according to the first embodiment, the second embodiment, although the sealing material 5 contains the second phosphors 13, in the light emitting device according to the embodiment, the sealing material may not contain the second phosphors.

What is claimed is:

1. A light emitting device comprising:
   a substrate;
   a plurality of light emitting elements mounted on the substrate, wherein each of the plurality of light emitting elements has a rectangular planar shape;
   a first wavelength conversion members disposed so as to cover at least a portion of the upper surface of at least two light emitting elements of the plurality of light emitting elements;
   a sealing material sealing the plurality of light emitting elements and the first wavelength conversion members; and
   a transparent layer formed of a material different from the sealing material and is disposed between the substrate, the plurality of light emitting elements and the first wavelength conversion members, and the sealing material, wherein
   at least one side of each of the at least two light emitting elements is disposed so as to face a side surface of the other light emitting element of the at least two light emitting elements,
   the first wavelength conversion members are disposed so as to cover at least a portion of the facing side surfaces of the at least two light emitting elements, and
   the first wavelength conversion members are disposed so as not to cover at least a portion of the non-facing side surfaces of the at least two light emitting elements.

2. The light emitting device according to claim 1, wherein the first wavelength conversion members are disposed so as to cover the vicinity of the non-facing side surface adjacent to the facing side surfaces of the at least two light emitting elements.

3. The light emitting device according to claim 1, wherein the plurality of light emitting elements include a plurality of first light emitting element rows in which the light emitting elements connected in series are disposed so that the first wavelength conversion members cover the upper surface and the facing side surfaces of the light emitting elements, and a plurality of second light emitting element rows in which the light emitting elements connected in series are disposed so that the first wavelength conversion members do not cover the upper surface and the facing side surfaces of the light emitting elements.

4. The light emitting device according to claim 3, wherein each of the plurality of first light emitting element rows includes first light emitting element groups having a plurality of light emitting elements disposed in each of the plurality of first mounting areas having the same area.

5. The light emitting device according to claim 4, wherein each of the plurality of first light emitting element groups includes four light emitting elements disposed in two rows and two columns.

6. The light emitting device according to claim 5, wherein each of the plurality of second light emitting element rows includes a second light emitting element groups having a plurality of light emitting elements disposed in each of the plurality of second mounting areas having the same area.

7. The light emitting device according to claim 6, wherein the second light emitting element row includes a light emitting element that is not disposed in any of the second mounting areas.

8. The light emitting device according to claim 7, wherein the light emitting element that is not disposed in any of the second mounting areas is disposed in an area between any of the first mounting areas and the outer edge of the mounting area on which the light emitting elements are mounted.

9. The light emitting device according to claim 3, wherein the sealing material includes second wavelength conversion members, a color temperature of first light emitted when the light emitting elements included in each of the plurality of first light emitting element rows emits light is different from a color temperature of the second light emitted when the light emitting elements included in each of the plurality of second light emitting element rows emits light.

10. The light emitting device according to claim 6, wherein the plurality of first light emitting element groups and the plurality of second light emitting element groups are disposed in parallel in the same direction.

11. The light emitting device according to claim 10, wherein the plurality of first light emitting element groups and the plurality of second light emitting element groups are disposed in a straight line.

12. The light emitting device according to claim 10, wherein the plurality of first light emitting element groups and the plurality of second light emitting element groups are disposed in a zigzag manner.

13. The light emitting device according to claim 3 further comprising:
a pair of first electrode pairs providing power to the plurality of first light emitting element rows;
first wiring patterns electrically connecting the plurality of first light emitting element rows and the pair of first electrode pairs;
a first overvoltage prevention element connected in parallel with the plurality of first light emitting elements;
a pair of second electrode pairs providing power to the plurality of second light emitting element rows;
second wiring patterns electrically connecting the plurality of second light emitting element rows and the pair of second electrode pairs; and
a second overvoltage preventing element connected in parallel with the plurality of second light emitting element, wherein
one of the first wiring patterns and the second wiring patterns has a plurality of wiring patterns electrically connected via a bonding wire.

14. The light emitting device according to claim 13, wherein one end of the bonding wire is connected to a wiring pattern connected to one of the first overvoltage preventing element and the second overvoltage preventing element.

15. The light emitting device according to claim 1, wherein the transparent layer is disposed so as to cover at least a portion of the first wavelength conversion members.

16. The light emitting device according to claim 1, wherein the transparent layer is further disposed between the substrate, the plurality of light emitting elements and the first wavelength conversion members, and the sealing material.

17. A light emitting device comprising:
a substrate;
a plurality of light emitting elements mounted on the substrate, wherein each of the plurality of light emitting elements has a rectangular planar shape;
a first wavelength conversion members disposed so as to cover at least a portion of the upper surface of at least two light emitting elements of the plurality of light emitting elements; and
a sealing material sealing the plurality of light emitting elements and the first wavelength conversion members; wherein
at least one side of each of the plurality of light emitting elements is disposed so as to face a side surface of the other light emitting element of the at least two light emitting elements,
the first wavelength conversion members are disposed so as to cover at least a portion of the facing side surfaces of the at least two light emitting elements, and
the first wavelength conversion members are disposed on the upper surface of the at least two light emitting elements so as not to cover the vicinity of corners apart from the facing side surfaces of the at least two light emitting elements.

18. The light emitting device according to claim 17, wherein the light emitting device further comprising a transparent layer formed of a material different from the sealing material and is disposed between the substrate, the plurality of light emitting elements and the first wavelength conversion members, and the sealing material.

19. A light emitting device comprising:
a substrate;
a plurality of light emitting elements mounted on the substrate, wherein each of the plurality of light emitting elements has a rectangular planar shape;
a first wavelength conversion members disposed so as to cover at least a portion of the upper surface of at least two light emitting elements of the plurality of light emitting elements; and
a sealing material sealing the plurality of light emitting elements and the first wavelength conversion members; wherein
at least one side of each of the plurality of light emitting elements is disposed so as to face a side surface of the other light emitting element of the at least two light emitting elements,
the first wavelength conversion members are disposed so as to cover at least a portion of the facing side surfaces of the at least two light emitting elements, and
the first wavelength conversion members are disposed so as not to cover the vicinity of outer side of the facing side surfaces of the at least two light emitting elements.

20. The light emitting device according to claim 19, wherein the light emitting device further comprising a transparent layer formed of a material different from the sealing material and is disposed between the substrate, the plurality of light emitting elements and the first wavelength conversion members, and the sealing material.

* * * * *